(12) United States Patent  (10) Patent No.: US 6,989,560 B2
Koike et al.  (45) Date of Patent: Jan. 24, 2006

(54) SEMICONDUCTOR DEVICE AND METHOD OF FABRICATING THE SAME

(75) Inventors: Hidetoshi Koike, Yokohama (JP); Tomoya Sanuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 56 days.

(21) Appl. No.: 10/676,123

(22) Filed: Oct. 2, 2003

(65) Prior Publication Data

US 2004/0065914 A1   Apr. 8, 2004

Related U.S. Application Data

(62) Division of application No. 10/097,382, filed on Mar. 15, 2002, now Pat. No. 6,667,503.

(30) Foreign Application Priority Data

Mar. 23, 2001  (JP) ............................. 2001-085882

(51) Int. Cl.
  *H01L 27/108* (2006.01)
  *H01L 21/8239* (2006.01)
  *G11C 11/24* (2006.01)

(52) U.S. Cl. ...................... 257/296; 257/301; 365/149; 438/296; 438/301

(58) Field of Classification Search ................ 257/301, 257/300, 68, 71, 532, 904–908; 438/386
See application file for complete search history.

(56) References Cited

U.S. PATENT DOCUMENTS

| 5,032,882 | A | * | 7/1991 | Okumura et al. ........... 257/302 |
| 5,034,341 | A |   | 7/1991 | Itoh |
| 5,838,038 | A | * | 11/1998 | Takashima et al. ......... 257/301 |
| 6,180,480 | B1 |  | 1/2001 | Economikos et al. |
| 6,194,755 | B1 |  | 2/2001 | Gambino et al. |
| 6,261,895 | B1 |  | 7/2001 | Adkisson et al. |
| 6,271,081 | B2 | * | 8/2001 | Kajiyama ................... 438/243 |
| 6,282,116 | B1 | * | 8/2001 | Kunkel et al. .............. 365/149 |
| 6,319,766 | B1 |  | 11/2001 | Bakli et al. |

FOREIGN PATENT DOCUMENTS

| JP | 62-286221 A |   | 12/1987 |
| JP | 4-192462 A |   | 7/1992 |
| JP | 08340088 A | * | 12/1996 |
| JP | 2000-022101 A |   | 1/2000 |
| JP | 2000-68502 A |   | 3/2000 |

* cited by examiner

*Primary Examiner*—Evan Pert
(74) *Attorney, Agent, or Firm*—Foley & Lardner LLP

(57) ABSTRACT

Since at least a portion of a trench capacitor electrode is formed by a metal, the electrical sheet resistance of the electrode can be lowered, and the signal propagation time prolonged by CR delay can be shortened. This can reduce the read/write time. The formation of a buried gate electrode can realize a reduction of the cell area, which is required in a DRAM- and a DRAM/logic-embedded device. This can increase the gate length and reduce the short channel effect. Since an insulating protective film is deposited on the gate electrode, a bit line contact can be formed in self-alignment.

10 Claims, 20 Drawing Sheets

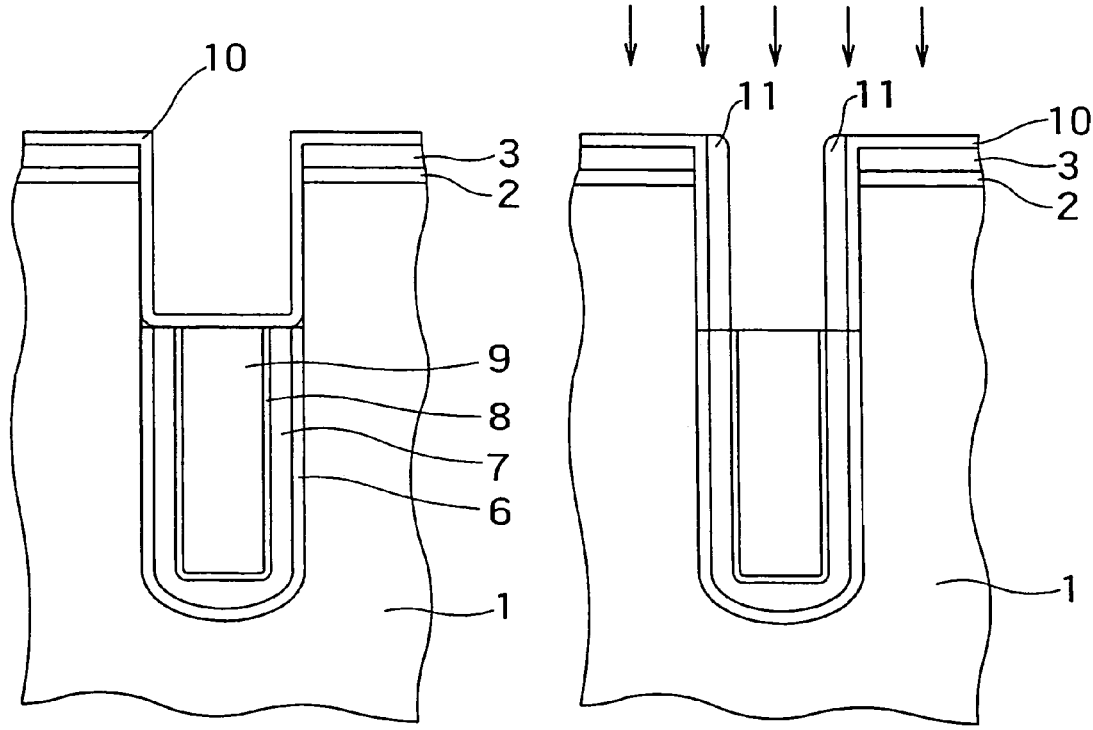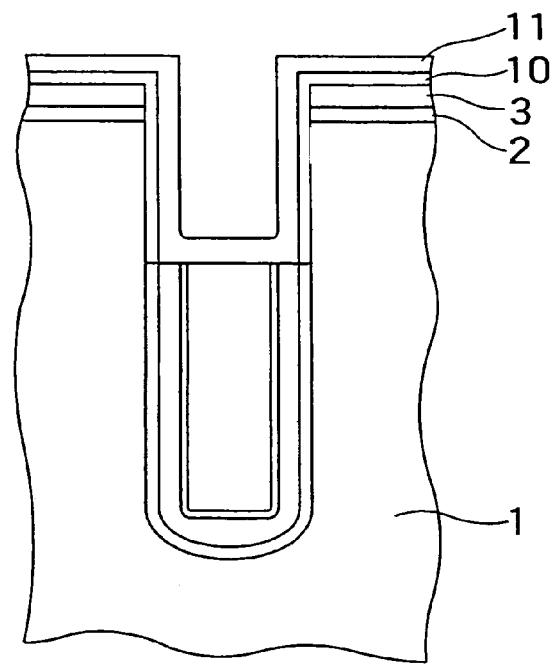
FIG. 5A   FIG. 5B
FIG. 5C

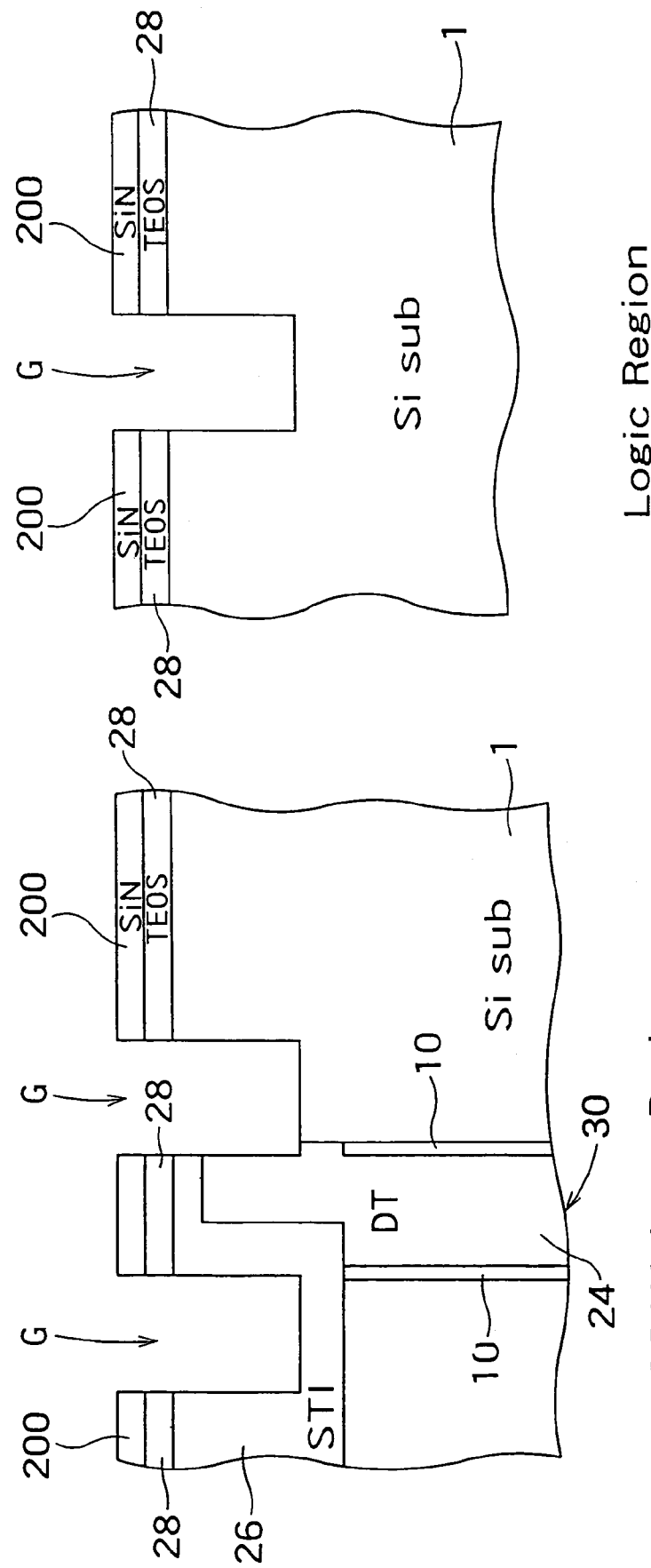
FIG. 12A DRAM Array Region
FIG. 12B Logic Region

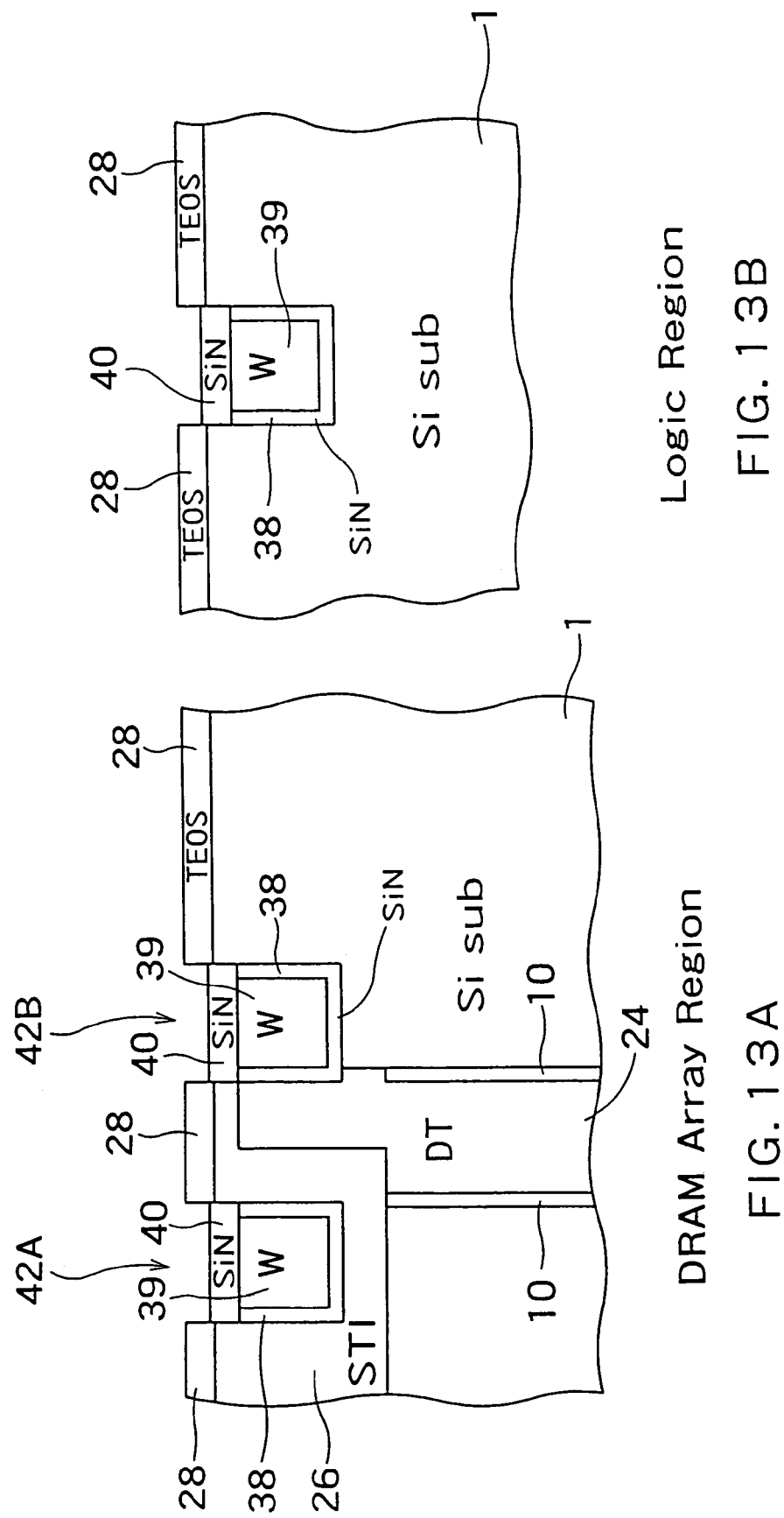

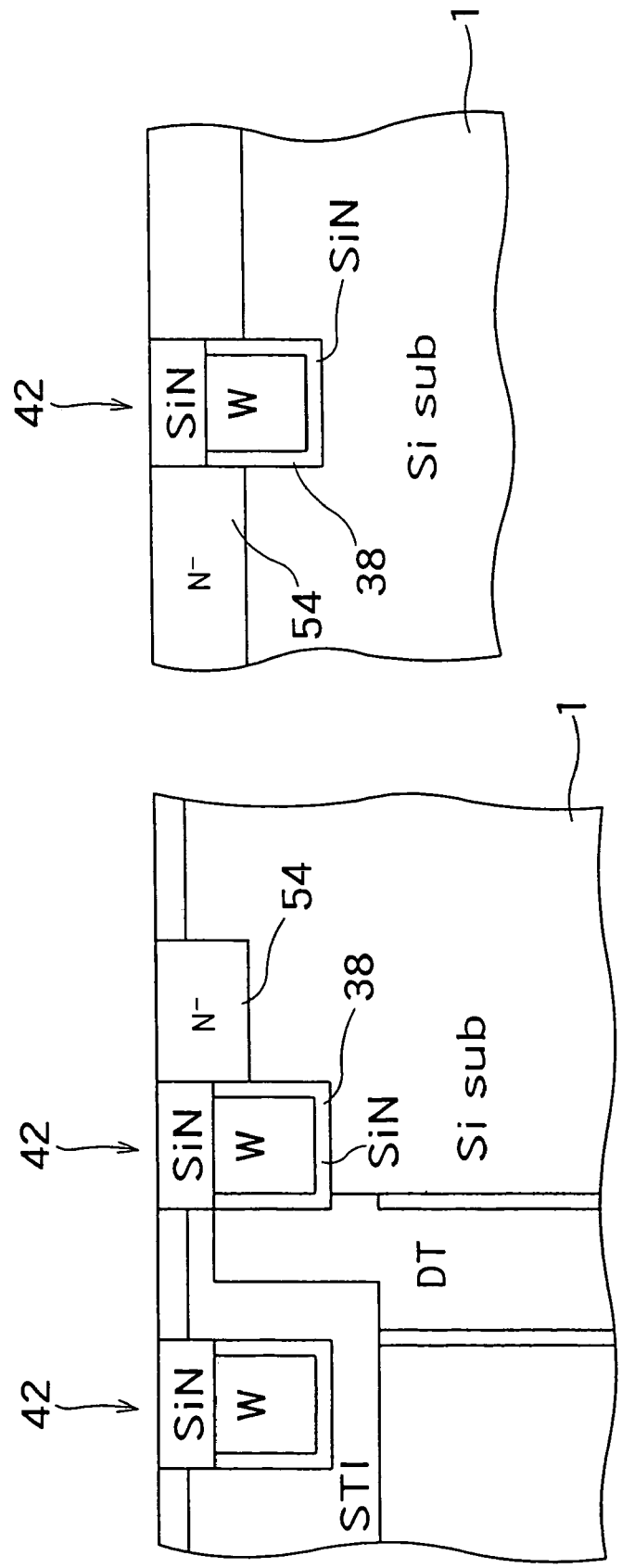
FIG. 15A DRAM Array Region
FIG. 15B Logic Region

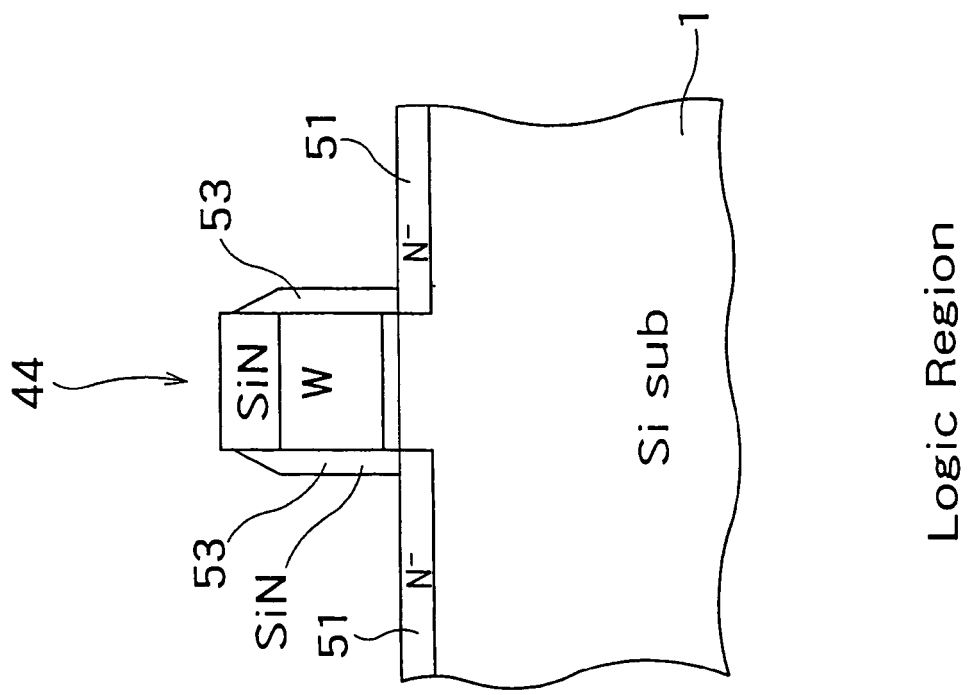
FIG. 16B  Logic Region
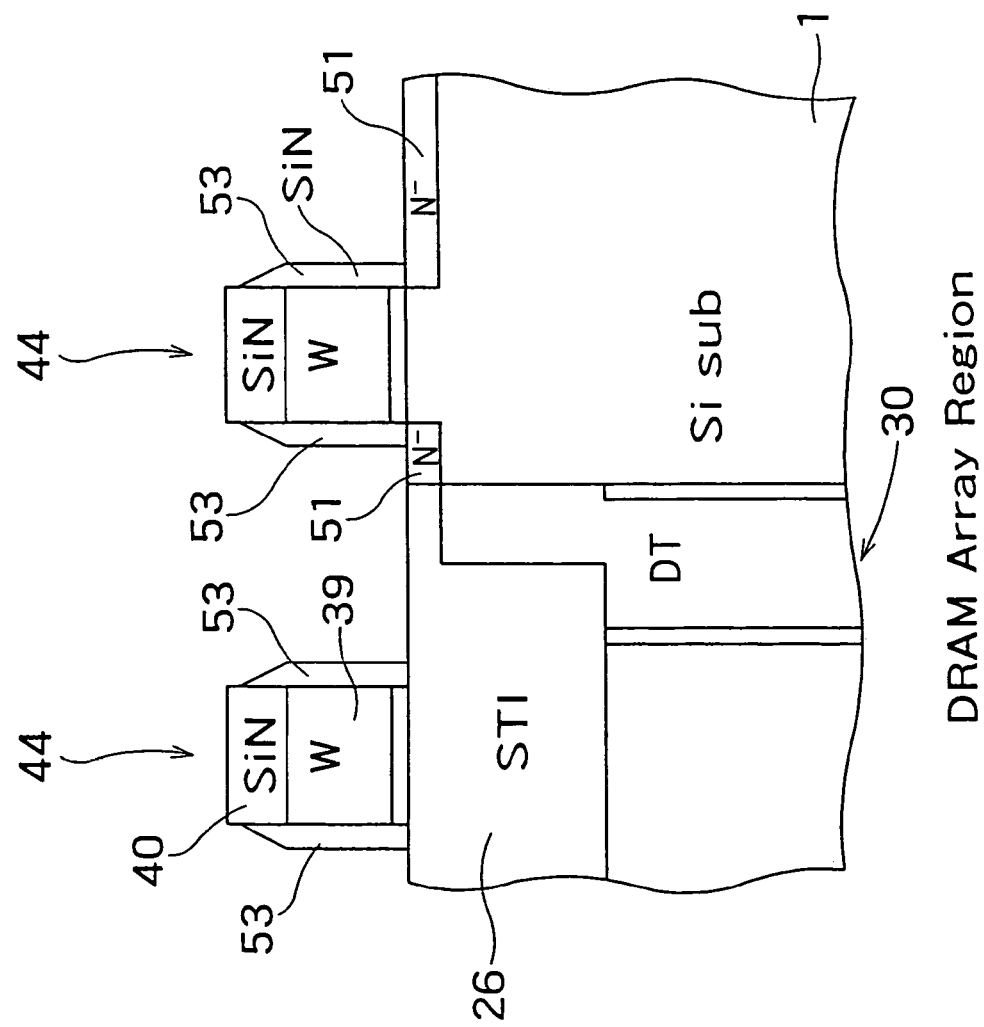
FIG. 16A  DRAM Array Region

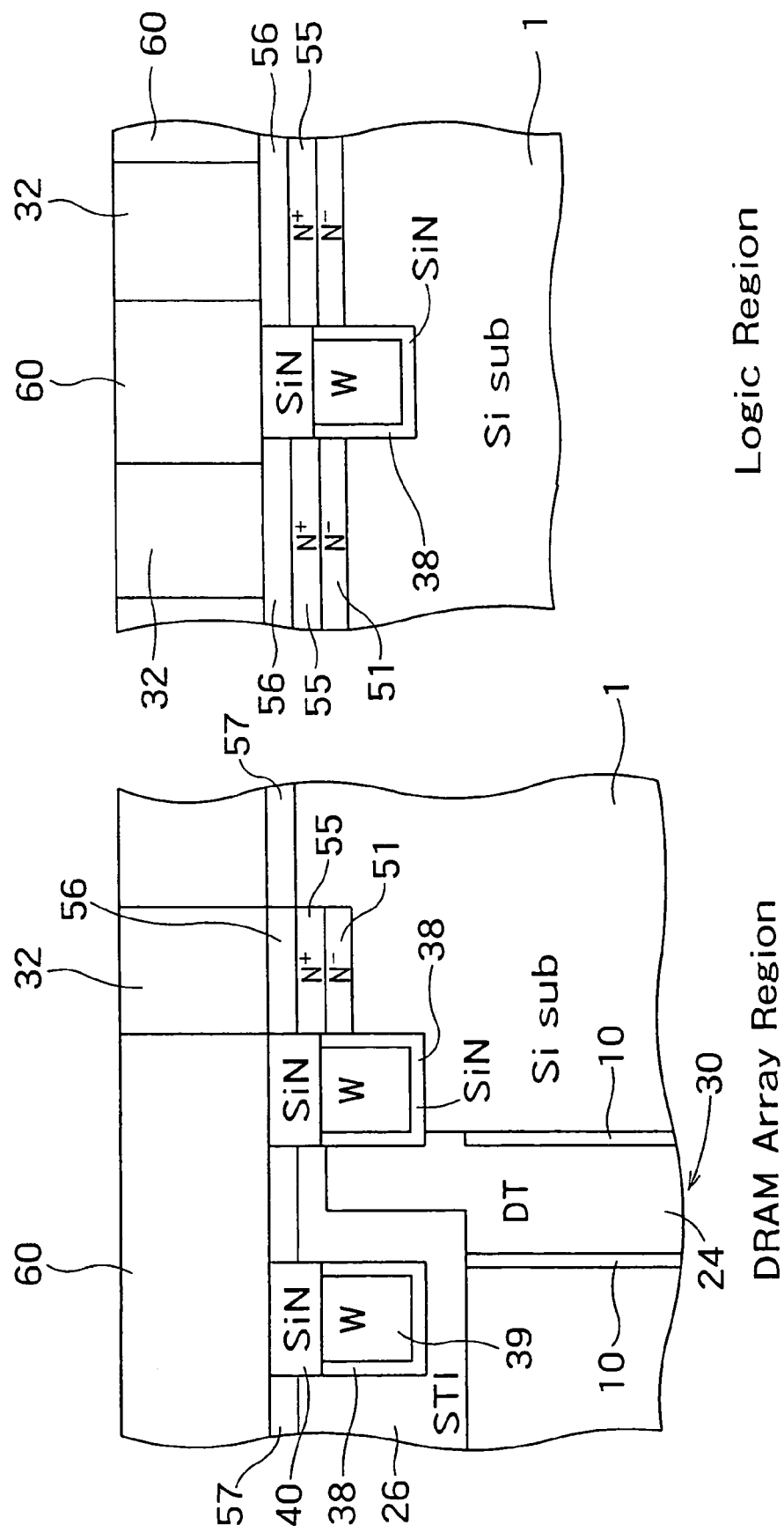

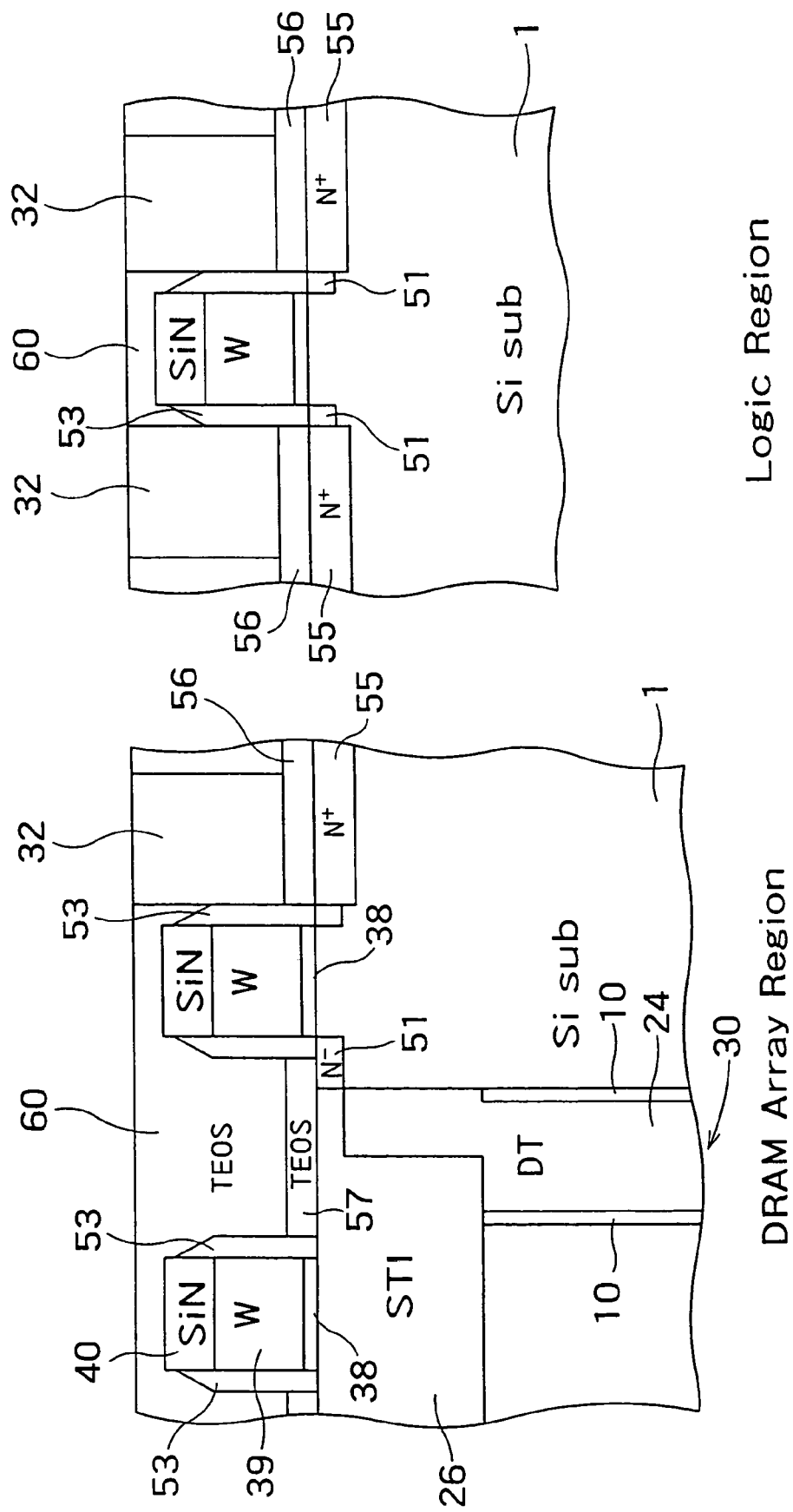
FIG. 18A DRAM Array Region
FIG. 18B Logic Region

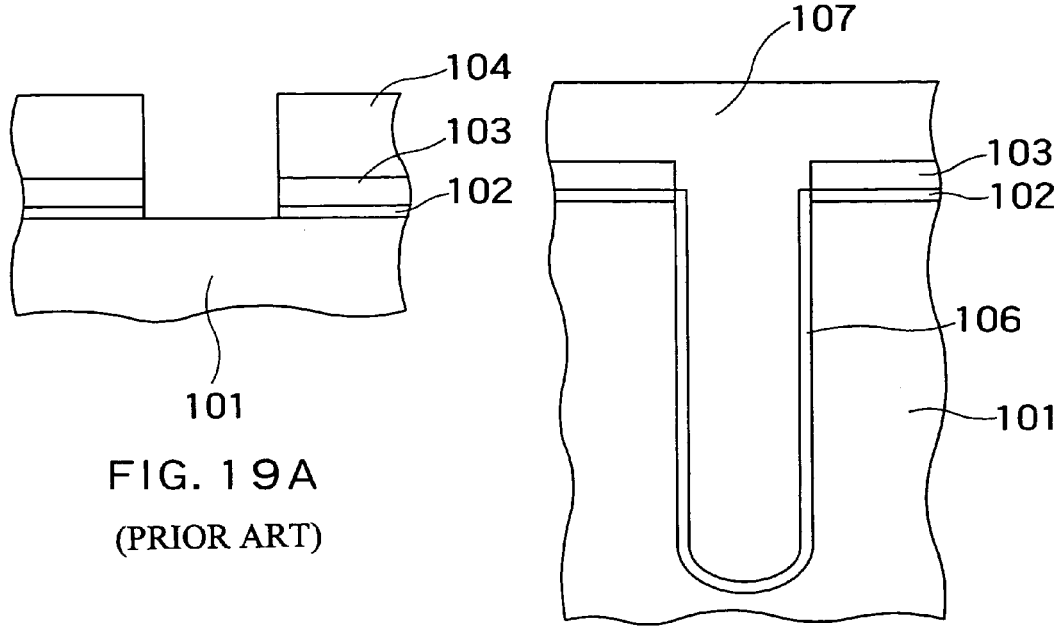
FIG. 19A
(PRIOR ART)
FIG. 19C
(PRIOR ART)
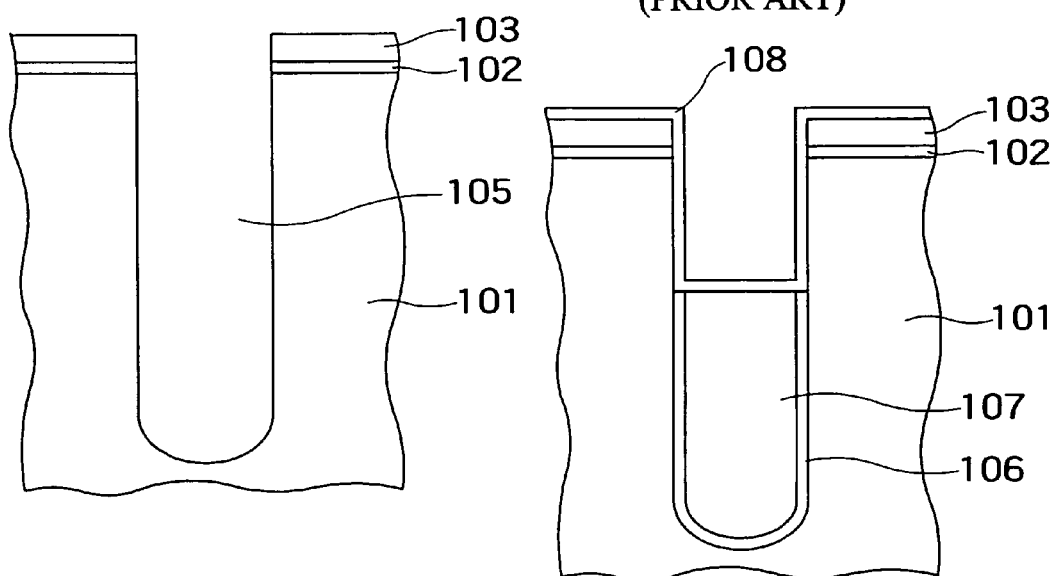
FIG. 19B
(PRIOR ART)
FIG. 19D
(PRIOR ART)

SEMICONDUCTOR DEVICE AND METHOD OF FABRICATING THE SAME

The present application is a divisional of U.S. application Ser. No. 10/097,382, filed Mar. 15, 2002 now U.S. Pat. No. 6,667,503, the entire contents of which are incorporated herein by reference.

CROSS REFERENCE TO RELATED APPLICATION

This application claims benefit of priority under 35 USC 119 to Japanese Patent Application No. 2001-85882, filed on Mar. 23, 2001, the entire contents of which are incorporated by reference herein.

BACKGROUND OF THE INVENTION

The present invention relates to a semiconductor device and a method of fabricating the same and, more particularly, to a semiconductor device and a method of fabricating the same, by which high-speed operations and high integration can be realized in a DRAM (Dynamic Random Access Memory) or in an embedded device having both a DRAM and a logic circuit.

A trench capacitor and a stacked capacitor are currently most popular as a storage node of a DRAM. In particular, a trench capacitor is often used as a capacitor suited to an embedded device for the following reasons. That is, since the capacitor can be formed before the formation of a logic circuit, the logic process is less influenced. In addition, the capacitor is buried in a silicon substrate, so no such deep contact formation as for a stacked capacitor is necessary in an interconnection step.

The structure of a trench capacitor relevant to the present invention will be described below with reference to its fabrication method.

FIGS. 19A to 20C are sectional views showing the steps of the method of fabricating the trench capacitor related to the present invention.

First, as shown in FIG. 19A, a 5-nm thick silicon oxide film 102 and a 150-nm thick silicon nitride film 103 are deposited on a silicon substrate 101. A photoresist 104 is removed by photolithography from a region where a trench is to be formed. The silicon oxide film 102 and the silicon nitride film 103 are etched away by RIE (Reactive Ion Etching).

As shown in FIG. 19B, RIE is again used to etch the silicon substrate 101, forming a trench 105 about 5 µm deep from the silicon surface. After that, the photoresist 104 is removed.

As shown in FIG. 19C, a silicon nitride film 106 about 5 nm thick is formed on the inner walls of the trench 105. Additionally, first polysilicon 107 doped with an n-type impurity such as arsenic (As) is deposited to have a thickness of about 500 nm, thereby completely filling the trench 105.

As shown in FIG. 19D, an etch back process using CMP (Chemical Mechanical Polishing) and RIE is performed to etch the surface of the polysilicon 107 to a depth of about 0.5 µm from the surface of the silicon substrate 101. Furthermore, the silicon nitride film 106 exposed to the inner walls of the trench is etched away, and a collar silicon oxide film 108 about 100 nm thick is deposited.

As shown in FIG. 20A, second polysilicon 109 is buried. More specifically, the collar silicon oxide film 108 on the substrate 101 is etched by RIE so as to remain only on the side walls of the trench. In addition, second polysilicon 109 doped with an n-type impurity such as arsenic is deposited by about 300 nm, thereby completely filling the trench 105.

Next, as shown in FIG. 20B, third polysilicon 110 is buried. More specifically, an etch back process using CMP and RIE is performed to etch the polysilicon 109 to a depth of 0.25 µm from the silicon surface. The exposed collar silicon oxide film 108 is etched away, and third polysilicon 110 doped with an n-type impurity such as arsenic is deposited by about 200 nm, thereby completely filling the trench 105.

Finally, as shown in FIG. 20C, an etch back process using CMP and RIE is performed to etch the polysilicon 110 to a depth of 0.05 µm from the surface of the silicon substrate 101. After that, the upper surface of the trench 105 is covered with a silicon oxide film 111, and the silicon nitride film 103 is removed to complete a trench capacitor buried in the silicon substrate.

As an electrical connection terminal to this trench capacitor, an n-type diffusion layer 112 formed by an n-type impurity such as arsenic oozing out from the third polysilicon 110 is used.

Unfortunately, this trench capacitor relevant to the present invention has the problem that read and write operations are difficult to perform at high speed. That is, This trench capacitor is formed by filling the 5-µm deep trench with the polysilicon portions 107, 109, and 110. Although each of these polysilicon portions is doped with an n-type impurity such as arsenic, the electrical sheet resistance is very high, about a few kΩ. This prolongs the time of signal propagation by CR delay, so the read/write time cannot be shortened.

Meanwhile, with the advance of information communication technologies, demands for high-speed, large-capacity DRAMs are more and more increasing. The latest 256-M versatile DRAM and a DRAM-embedded logic device formed by the 0.18-µm rule use the above-mentioned trench capacitor structure. However, the operating speed is limited for the above reason.

Also, these devices must be improved in many respects from the viewpoint of integration density. That is, these devices relevant to the present invention use a "folded bit line system" in order to reduce the cell area. To further advance micropatterning and high integration, it is necessary to, e.g., ① shorten the gate length of a cell transistor, ② use a self-aligned contact structure as a bit line contact, and ③ use a newly designed cell.

Furthermore, in present DRAM/logic embedded devices, salicide is adhered to the gate in order to improve the data transfer rate of the DRAM. To further improve this data transfer rate, it is necessary to develop a novel capacitor structure having a lower resistance and to also develop a gate electrode structure matching well with this novel capacitor structure.

SUMMARY OF THE INVENTION

According to an aspect of the present invention, there is provided a semiconductor device having a trench capacitor, wherein the trench capacitor comprises a trench formed in a semiconductor substrate, an insulating layer formed on the inner wall surfaces of the trench, and an electrode portion formed inside the trench having the insulating layer, and the electrode portion has a metal portion.

According to another aspect of the present invention, there is provided a semiconductor device wherein four memory capacitors are arranged into a substantially cross shape around a bit line contact, and each of the four memory capacitors can be connected to the bit line contact.

According to still another aspect of the present invention, there is provided a semiconductor device comprising a bit line contact, four memory capacitors formed around the bit line contact, and four gate electrodes formed between the four memory capacitors and the bit line contact.

According to still another aspect of the present invention, there is provided a semiconductor device comprising a bit line contact, a plurality of gate electrodes formed around the bit line contact, and a plurality of memory capacitors formed around the bit line contact, wherein each of the plurality of memory capacitors and the bit line contact can be connected or disconnected by changing a voltage to be applied to a corresponding one of the plurality of gate electrodes, and at least one of the plurality of gate electrodes is formed on a predetermined surface, and the other of the plurality of gate electrodes is formed below the predetermined surface.

According to an aspect of the present invention, there is provided a method of fabricating a semiconductor device in which a plurality of trench capacitors are formed around a bit line contact, and each of the plurality of trench capacitors can be connected to or disconnected from the bit line contact, comprising the steps of forming the plurality of trench capacitors on a semiconductor substrate, forming some of a plurality of gate electrodes each for performing switching for a corresponding one of the plurality of trench capacitors, such that the some gate electrodes are buried in the surface of the substrate, forming the remaining ones of the plurality of gate electrodes on the surface of the substrate so as to be substantially perpendicular to the some gate electrodes, covering the side surfaces of the remaining gate electrodes with an insulating layer, and forming the bit line contact in contact with the insulating layer.

BRIEF DESCRIPTION OF THE DRAWINGS

FIGS. 5A to 5C are sectional views showing the major steps of a method of fabricating the capacitor of the modification;

FIGS. 12A and 12B are sectional views showing the steps of a method of fabricating a memory cell and logic circuit portion according to the third embodiment of the present invention;

FIGS. 13A and 13B are sectional views showing the steps of the method of fabricating the memory cell and logic circuit portion of the third embodiment;

FIGS. 15A and 15B are sectional views showing the steps of the method of fabricating the memory cell and logic circuit portion of the third embodiment;

FIGS. 16A and 16B are sectional views showing the steps of the method of fabricating the memory cell and logic circuit portion of the third embodiment;

FIGS. 17A and 17B are sectional views showing the steps of the method of fabricating the memory cell and logic circuit portion of the third embodiment;

FIGS. 18A and 18B are sectional views showing the steps of the method of fabricating the memory cell and logic circuit portion of the third embodiment;

FIGS. 19A to 19D are sectional views showing the steps of a method of fabricating a trench capacitor relevant to the present invention.

DESCRIPTION OF THE PREFERRED EMBODIMENTS

Embodiments of the present invention will be described below with reference to the accompanying drawings.

(First Embodiment)

As the first embodiment of the present invention, a semiconductor device having a capacitor capable of high-speed operation will be explained.

Figure 1:
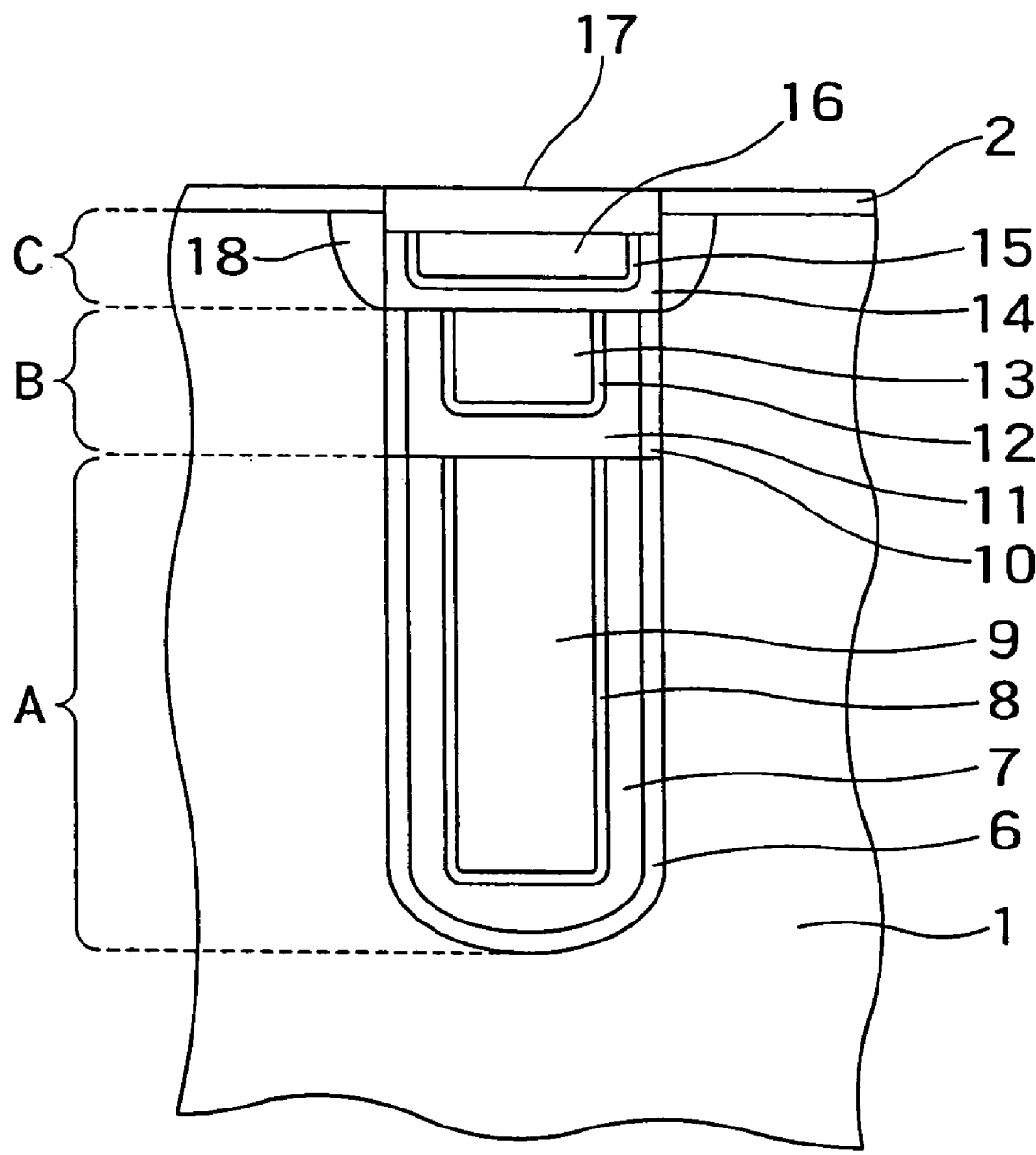
FIG. 1 is a conceptual view showing the main sectional structure of a capacitor formed in a semiconductor device according to the first embodiment of the present invention.

FIG. 1 is a conceptual view showing the major sectional structure of the capacitor formed in the semiconductor device of this embodiment.

That is, this capacitor is a trench capacitor formed in a silicon substrate 1; the capacitor is divided into three regions A, B, and C in the longitudinal direction of the trench. In the region A at the bottom portion of the trench, a nitride film 6, polysilicon 7, a barrier layer 8, and a metal electrode 9 are formed in this order from the trench inner walls. In the region B in the middle of the trench, a collar silicon oxide film 10, polysilicon 11, a barrier layer 12, and a metal electrode 13 are formed in this order from the trench inner walls. In the region C at the entrance of the trench, polysilicon 14, a barrier layer 15, and a metal electrode 16 are formed in the order named from the trench inner walls.

In addition, a diffusion region 18 is formed in the silicon substrate 11 in a portion around the region C.

In this embodiment as described above, the main portions of the electrodes buried in the trench are formed by the metal electrodes 9, 13, and 16. The sheet resistance of these metals is only a few $\Omega$, which is much lower than the sheet resistance (about a few k$\Omega$) of polysilicon. Accordingly, the CR constant can be greatly lowered compared to that of a capacitor using polysilicon electrodes. As a consequence, it is possible to greatly improve the transfer rate of the capacitor and thereby remarkably raise the operating speed of a DRAM or a DRAM/logic embedded device.

More specifically, the upper limit of the system clock frequency of a semiconductor device using a capacitor having polysilicon electrodes is about 200 MHz. In contrast, when the capacitor of this embodiment is used, the clock frequency upper limit can be increased tenfold or more.

Also, since at least a portion of the electrode of the trench capacitor is formed by polysilicon and metal, advantages common to the structure using a polysilicon electrode can be obtained. This facilitates ensuring the reliability of the fabrication process and element.

In addition, since portions (the titanium nitride layers 8, 12, and 15) made of a metal nitride are formed between the metal and the polysilicon, it is possible to obtain the function of a barrier layer and the effect of preventing peeling.

Furthermore, the metal portion of the electrode of the trench capacitor is divided into a plurality of regions along the direction of depth of the trench. This makes it possible to divisionally form the storage node at the bottom portion of the trench and the collar silicon film near the bottom of the trench.

The resistance of the electrode can be further lowered by continuously forming this metal portion along the direction of depth of the trench.

Examples of the material of the metal electrodes 9, 13, and 16 used in this embodiment are tungsten (W), tantalum (Ta), nickel (Ni), molybdenum (Mo), titanium (Ti), aluminum (Al), and copper (Cu), the process of each of which is established in silicon devices. Of these metals, when a refractory metal such as tungsten or molybdenum is used, deterioration of the semiconductor can be suppressed even when it is necessary to expose the device to high temperatures during the fabrication process. This can maintain the reliability at high level.

On the other hand, when a high-conductivity metal such as aluminum or copper is used, it is possible to increase the transfer rate of the capacitor and perform high-speed operations.

Referring to FIG. 1, the metal electrodes used in the regions A, B, and C need not be made from the same material. That is, these metal electrodes 9, 13, and 16 can also be formed by different materials.

In the structure shown in FIG. 1, the polysilicon portions 11 and 14 and the barrier layers 12 and 15 interpose in the boundaries between the regions A, B, and C. However, the present invention is not limited to this embodiment. This portion will be described in detail later by taking a modification as an example.

A method of fabricating the trench capacitor shown in FIG. 1 will be described below.

FIGS. 2A to 3C are sectional views showing the steps of a method of fabricating the capacitor of the fist embodiment.

Figure 2A:
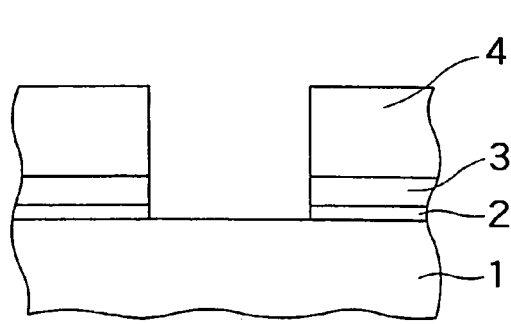
FIGS. 2A to 2D are sectional views showing the steps of a method of fabricating the capacitor of the first embodiment.

First, as shown in FIG. 2A, a 5-μmm thick silicon oxide film 2 and a 150-μmm thick silicon nitride film 3 are deposited on a silicon substrate 1. A photoresist 4 is removed by photolithography from a region where a trench is to be formed. The silicon oxide film 2 and the silicon nitride film 3 are etched away by RIE.

As shown in FIG. 2B, RIE is again used to etch the silicon substrate 1, forming a trench 5 about 5 μm deep from the surface of the substrate 1, and the photoresist 4 is removed.

Figure 2C:
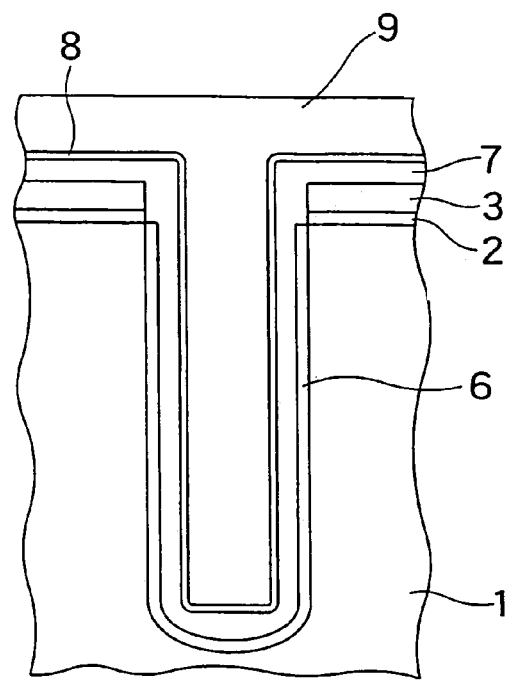
Figure 2B:
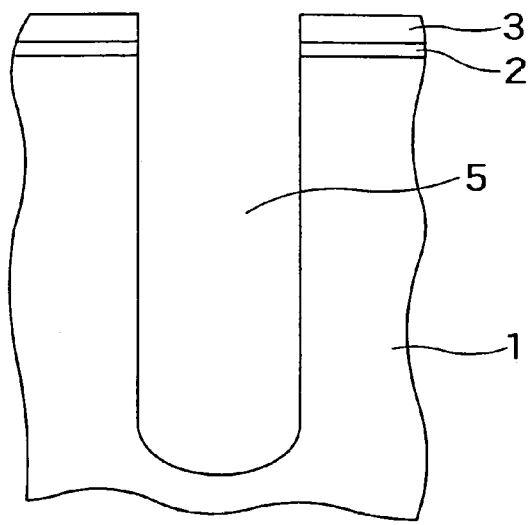

As shown in FIG. 2C, the trench is filled. More specifically, a silicon nitride film 6 about 5 nm thick is formed on the inner walls of the trench 5. First polysilicon 7 doped with an n-type impurity such as arsenic (As) is deposited by 50 nm, thereby covering the inner walls of the trench 5 with this polysilicon 7. Additionally, titanium nitride 8 and tungsten (W) 9 are deposited to have thicknesses of about 10 nm and about 450 nm, respectively, thereby completely filling the trench 5. This titanium nitride 8 functions as a barrier layer for preventing diffusion of the tungsten 9 into the semiconductor substrate 1, and also functions as a glue layer for improving adhesion between the polysilicon 7 and the tungsten 9.

Figure 2D:
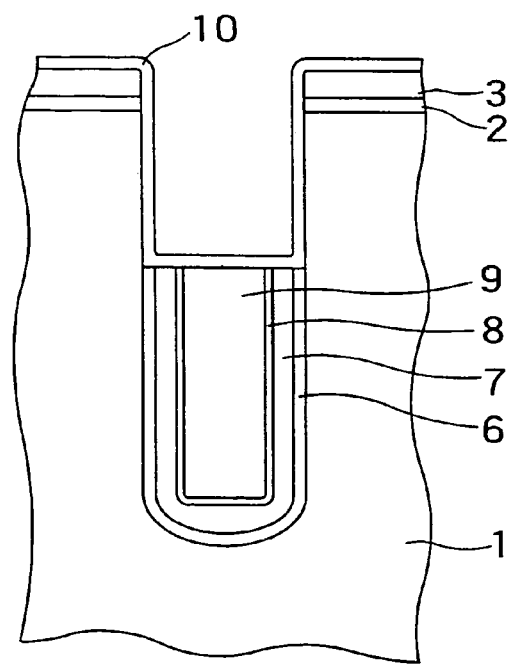

As shown in FIG. 2D, the trench is etched. More specifically, an etch back process using CMP and RIE is performed to etch the polysilicon 7, the titanium nitride 8, and the tungsten 9 to a depth of about 0.5 μm from the surface of the substrate 1. After that, the silicon nitride film 6 exposed to the inner walls of the trench is etched away, and a collar silicon oxide film 10 about 100 nm thick is deposited.

Figures 3A, 3B:
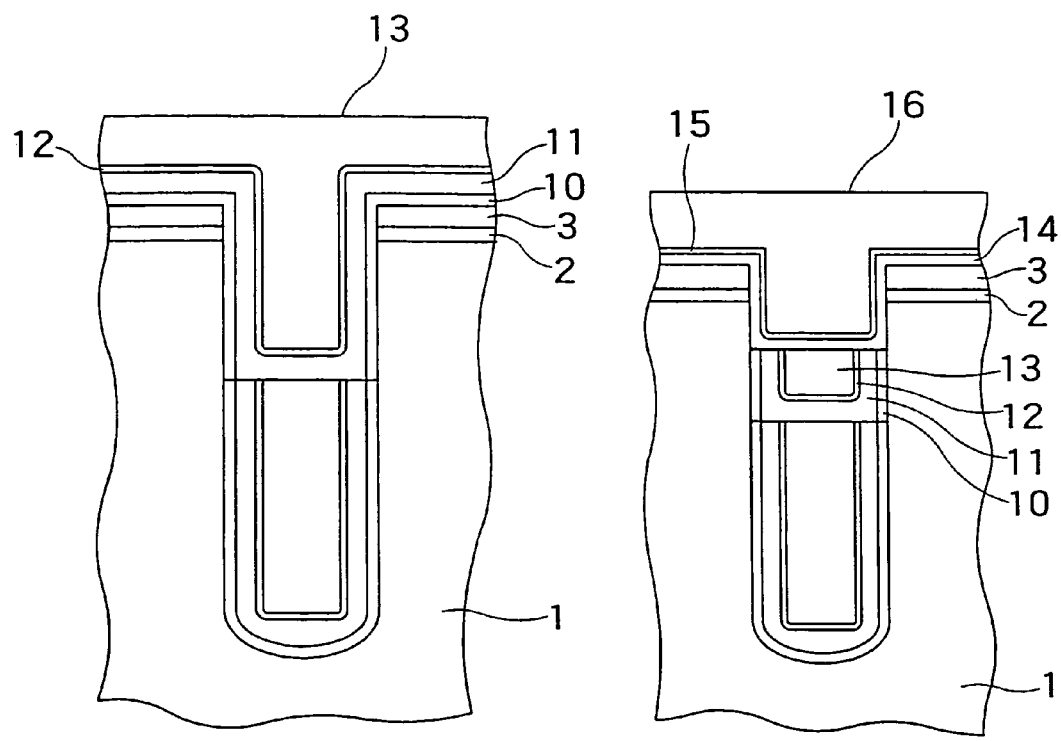
FIGS. 3A to 3C are sectional views showing the steps of the method of fabricating the capacitor of the first embodiment.

As shown in FIG. 3A, the trench is filled again. More specifically, the collar silicon oxide film 10 is etched by RIE so as to remain only on the side walls of the trench. After that, second polysilicon 11 doped with an n-type impurity such as arsenic is deposited by about 50 nm to cover the inner walls of the trench 5 with this polysilicon 11. Subsequently, titanium nitride 12 and tungsten 13 are deposited by about 10 nm and about 250 nm, respectively, thereby completely filling the trench 5. This titanium nitride 12 also functions as both a barrier layer and a glue layer.

Next, as shown in FIG. 3B, a buried structure near the opening of the trench is formed. More specifically, an etch back process using CMP and RIE is performed to etch the polysilicon 11, the titanium nitride 12, and the tungsten 13 to a depth of about 0.25 μm from the surface of the substrate 1. After that, the collar silicon oxide film 10 exposed to the trench inner walls is etched away, and third polysilicon 14 doped with an n-type impurity such as arsenic is deposited by about 50 nm to cover the inner walls of the trench 5 with this polysilicon 14. Subsequently, titanium nitride 15 and tungsten 16 are deposited by about 10 nm and 150 nm, respectively, thereby completely filling the trench 5. This titanium nitride 15 also functions as both a barrier layer and a glue layer.

Figure 3C:
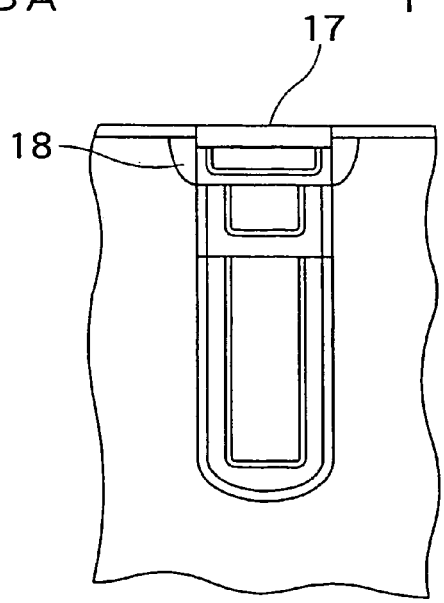

Finally, as shown in FIG. 3C, the trench is covered. More specifically, an etch back process using CMP and RIE is performed to etch the polysilicon 14, the titanium nitride 15, and the tungsten 16 to a depth of about 0.05 μm from the surface of the substrate 1. After that, the upper surface of the trench 5 is covered with a silicon oxide film 17, and the silicon nitride film 3 is removed. Consequently, as shown in FIG. 3C and FIG. 1, a trench capacitor buried in the silicon substrate is completed.

As an electrical connection terminal to this trench capacitor, a diffusion region 18 formed by an n-type impurity such as arsenic oozing out from the third polysilicon 14 can be used.

The trench capacitor shown in FIG. 1 can be fabricated as described above.

Next, a modification of this embodiment will be explained.

Figure 4:
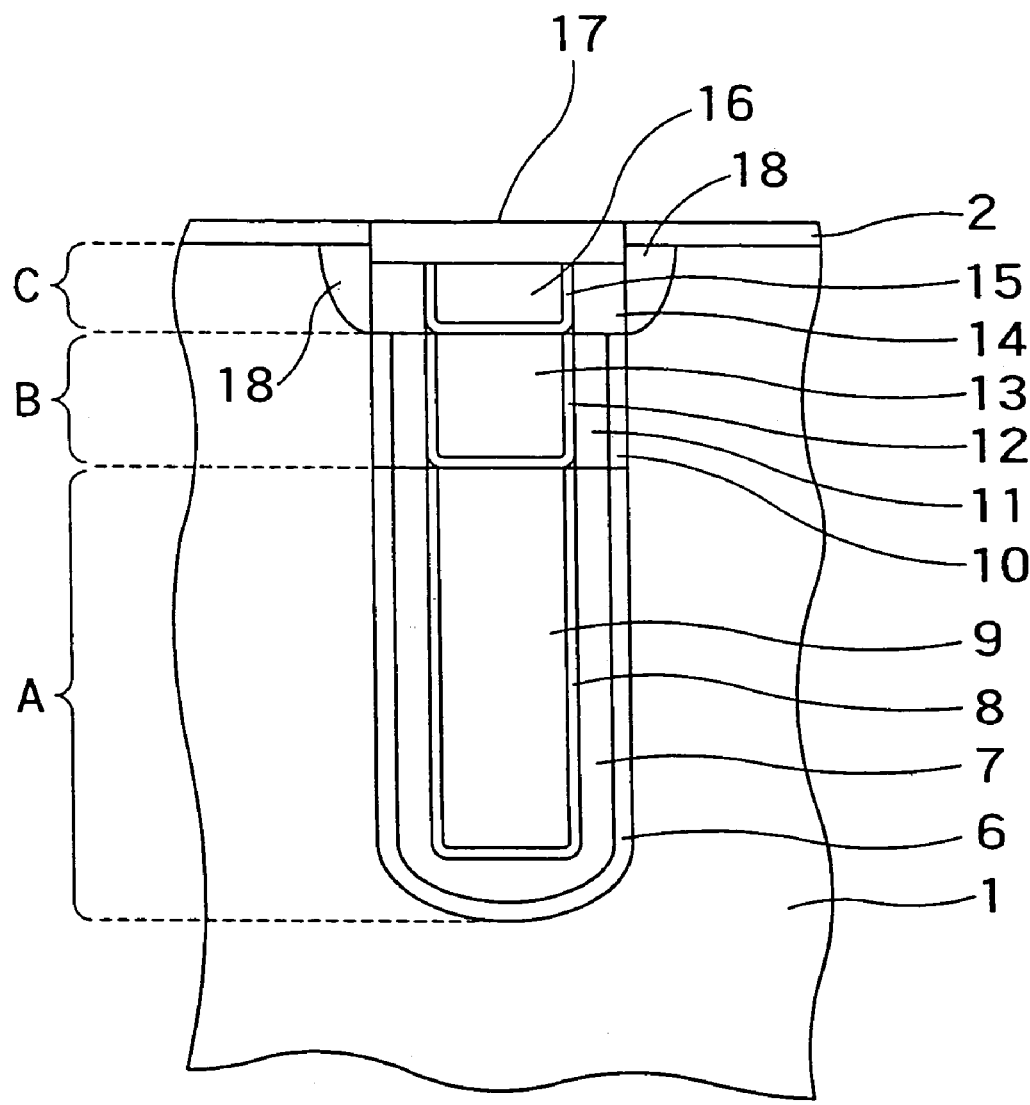
FIG. 4 is a conceptual view showing the sectional structure of a capacitor as a modification of the first embodiment.

FIG. 4 is a conceptual view showing the sectional structure of a capacitor as a modification of this embodiment.

That is, in the capacitor shown in FIG. 4, metal electrodes 9, 13, and 16 are continuously formed with only barrier metals 12 and 15 between them, without forming polysilicon portions 11 and 14. In this structure, electric charge can be transferred from the metal electrode 9 in a bottom region A with no intervention of polysilicon. This can further increase the operating speed.

A method of fabricating the capacitor of this modification will be explained below.

FIGS. 5A to 5C are sectional views showing the major steps of the method of fabricating the capacitor of this modification. That is, FIGS. 5A to 5C illustrate some of the steps of forming a region B on an already formed region A, corresponding to the steps shown in FIGS. 2D and 3A.

In this modification, as in the above embodiment, a collar silicon oxide film 10 is formed on the inner walls of a trench as shown in FIG. 5A.

Next, as shown in FIG. 5B, this collar silicon oxide film 10 on the bottom of the trench is etched by RIE so as to remain only on the side walls of the trench. After that, second polysilicon 11 is deposited to cover the inner walls of the trench.

As shown in FIG. 5C, the polysilicon 11 is etched back. More specifically, an etching method having strong anisotropy such as RIE is used to perform etching in a direction indicated by the arrows in FIG. 5B. Consequently, those portions of the polysilicon 11 which exist on the bottom of the trench and on a substrate 1 are preferentially etched, and the portion covering the trench side walls remains.

When a tungsten electrode 9 is thus exposed to the bottom of the trench, a barrier layer 12 and a metal electrode 13 are deposited in this order as described previously with reference to FIG. 3A.

Although not shown, a region C is similarly formed. That is, polysilicon 14 is etched back by anisotropic etching to remove only a portion of this polysilicon 14 on the bottom of the trench and expose the metal electrode 13. A barrier layer 15 and a metal electrode 16 are deposited on this exposed metal electrode 13.

The structure of the modification shown in FIG. 4 can be fabricated as explained above.

(Second Embodiment)

As the second embodiment of the present invention, a capacitor containing no polysilicon will be explained.

Figure 6:
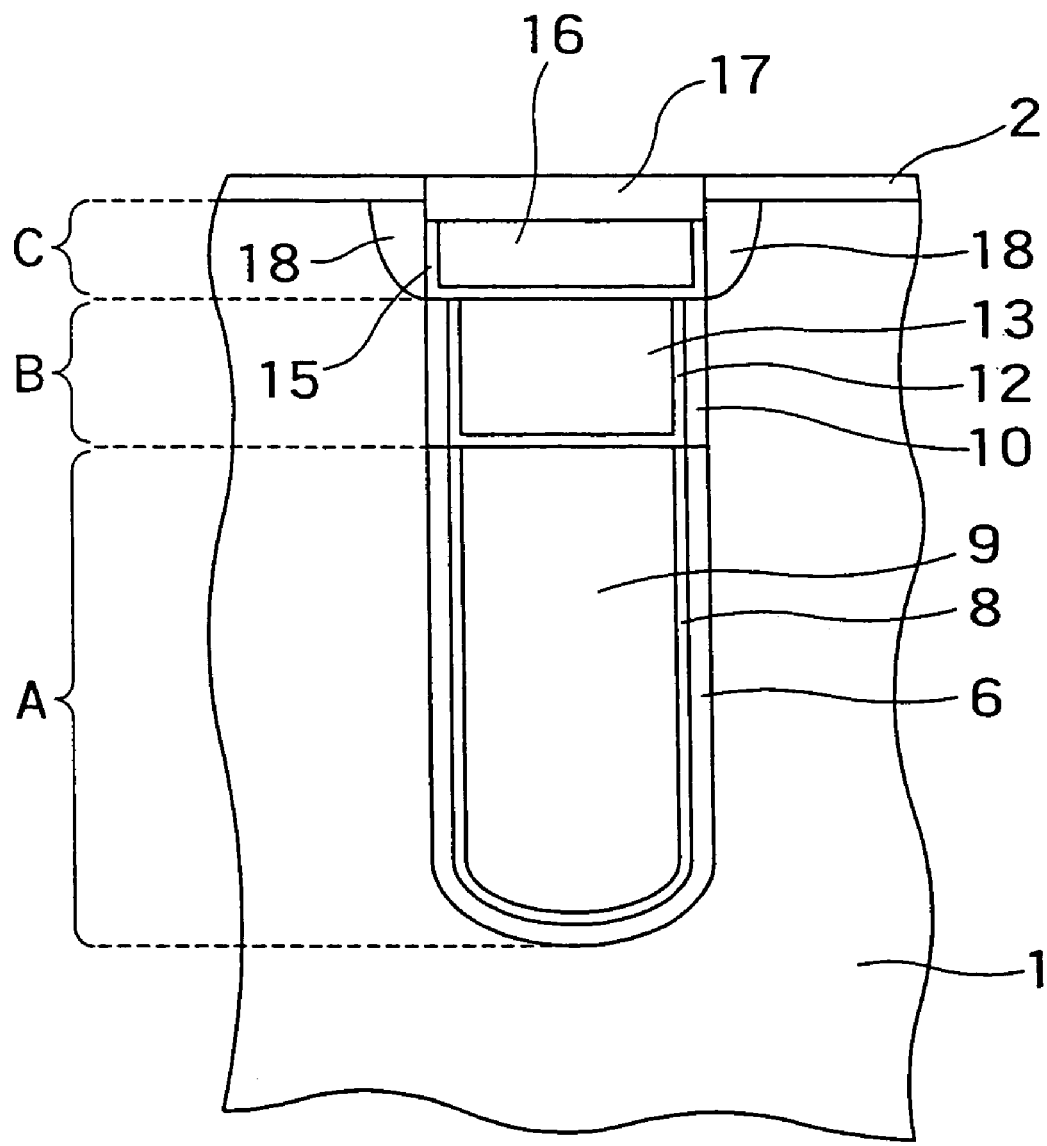
FIG. 6 is a conceptual view showing the main sectional structure of a capacitor formed in a semiconductor device according to the second embodiment of the present invention.

FIG. 6 is a conceptual view showing the major sectional structure of the capacitor formed in a semiconductor device of this embodiment. The same reference numerals as in FIGS. 1 to 5C denote the same elements in FIG. 6, and a detailed description thereof will be omitted.

That is, compared to the capacitor shown in FIG. 1, this capacitor is characterized in that no polysilicon portions 7, 11, and 14 are formed. More specifically, a trench is filled with metal electrodes, and this can further improve the conductivity. As a consequence, it is possible to further improve the charge transfer rate and allow the semiconductor device to operate at higher speed.

In this embodiment, as in the above first embodiment, the metal electrodes used in regions A, B, and C can be made from the same material or different materials.

A method of fabricating the trench capacitor according to this embodiment will be described below.

FIGS. 7A to 8C are sectional views showing the steps of a method of fabricating the capacitor of the second embodiment.

Figure 7A:
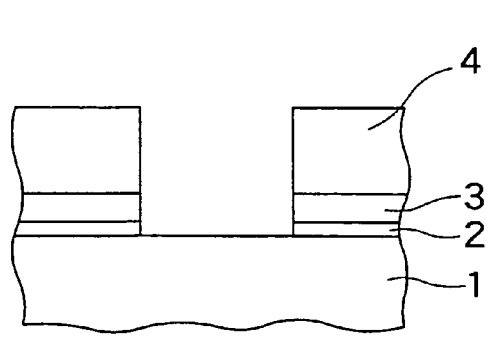
FIGS. 7A to 7D are sectional views showing the steps of a method of fabricating the capacitor of the second embodiment.

First, as shown in FIG. 7A, a 5-nm thick silicon oxide film 2 and a 150-nm thick silicon nitride film 3 are deposited on a silicon substrate 1. A photoresist 4 is removed by photolithography from a region where a trench is to be formed. The silicon oxide film 2 and the silicon nitride film 3 are etched away by RIE.

Next, as shown in FIG. 7B, RIE is again used to etch the silicon substrate 1, forming a trench 5 about 5 μm deep from the silicon surface, and the photoresist 4 is removed after that.

Figure 7C:
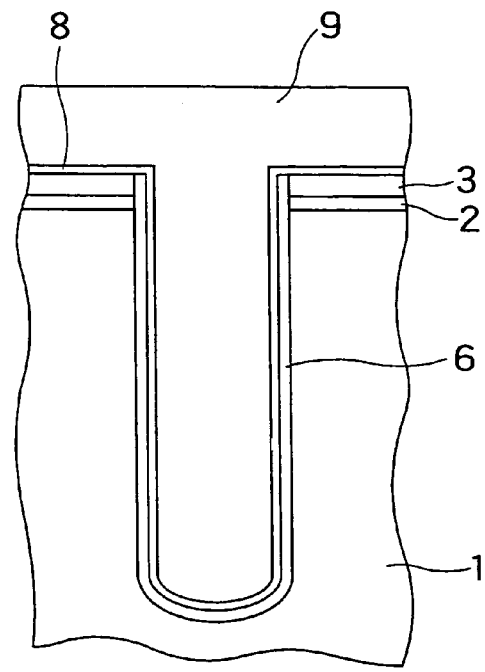
Figure 7B:
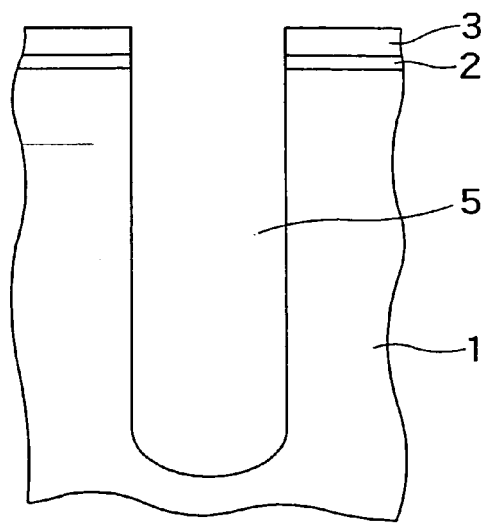

As shown in FIG. 7C, a 5-nm thick silicon nitride film 6 is formed on the inner walls of the trench 5. 10-nm thick titanium nitride 8 and 500-nm thick tungsten 9 are sequentially deposited to completely fill the trench 5.

Figure 7D:
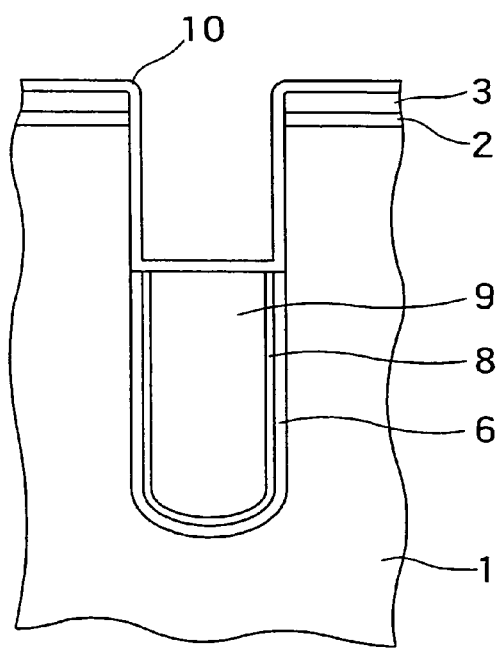

As shown in FIG. 7D, an etch back process using CMP and RIE is performed to etch the titanium nitride 8 and the tungsten 9 to a depth of about 0.5 μm from the substrate surface. After that, the exposed silicon nitride film 6 is etched away, and a collar silicon oxide film 10 about 100 nm thick is deposited.

Figure 8A:
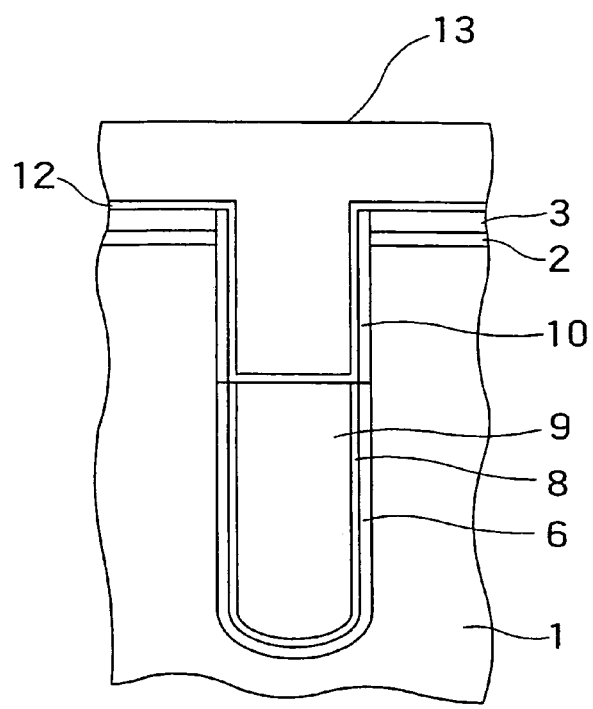
FIGS. 8A to 8C are sectional views showing the steps of the method of fabricating the capacitor of the second embodiment.

As shown in FIG. 8A, this collar silicon oxide film 10 is etched by RIE so as to remain only on the side walls of the trench. After that, 10-nm thick titanium nitride 12 and 300-nm thick tungsten 13 are deposited to completely fill the trench 5.

Figure 8B:
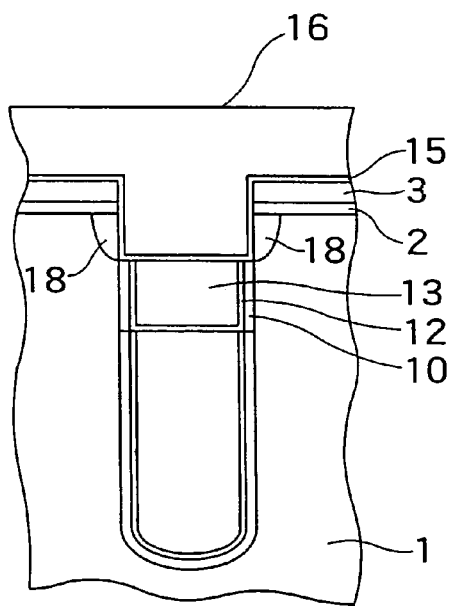

Next, as shown in FIG. 8B, an etch back process using CMP and RIE is performed to etch the titanium nitride 12 and the tungsten 13 to a depth of about 0.25 μm from the substrate surface. After that, the exposed collar silicon oxide film 10 is etched away, and a diffusion layer 18 is formed by ion implantation or the like by doping an n-type impurity such as arsenic. In addition, titanium nitride 15 and tungsten 16 are deposited in this order by about 10 nm and about 200 nm, respectively, thereby completely filling the trench 5.

Figure 8C:
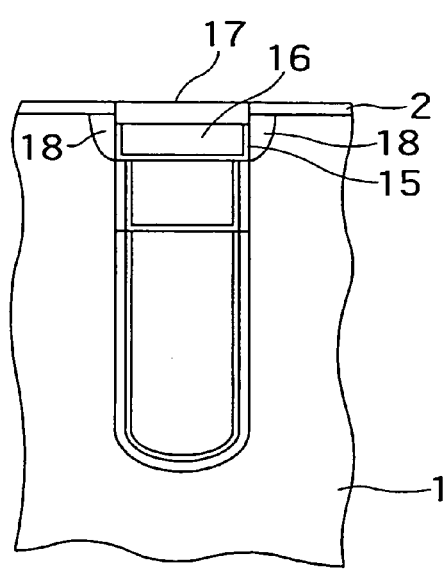

Finally, as shown in FIG. 8C, an etch back process using CMP and RIE is performed to etch the titanium nitride 15 and the tungsten 16 to a depth of about 0.05 μm from the substrate surface. After that, the upper surface of the trench 5 is covered with a silicon oxide film 17, and the silicon nitride film 3 is removed. Consequently, a trench capacitor buried in the silicon substrate 1 is completed. As an electrical connection terminal to this trench capacitor, the diffusion layer 18 formed by the n-type impurity such as arsenic can be used.

(Third Embodiment)

As the third embodiment of the present invention, a semiconductor device having memory cells capable of greatly increasing the integration density will be described below.

Figure 9:
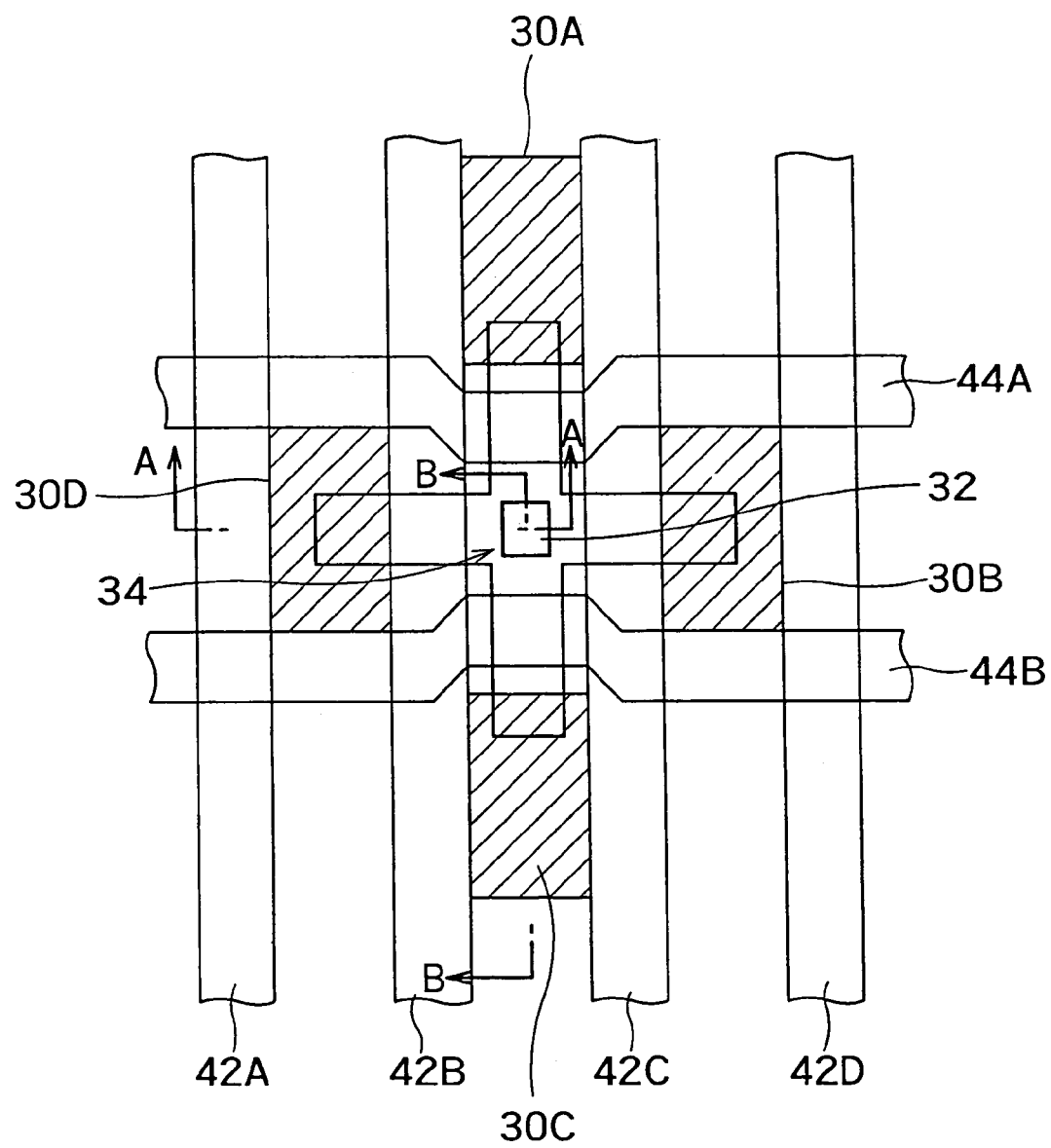
FIG. 9 is a conceptual layout view showing the planar arrangement of memory cells of a semiconductor device according to the third embodiment of the present invention.

FIG. 9 is a conceptual layout view showing the planar arrangement of the memory cells of the semiconductor device of this embodiment.

Figure 10C:
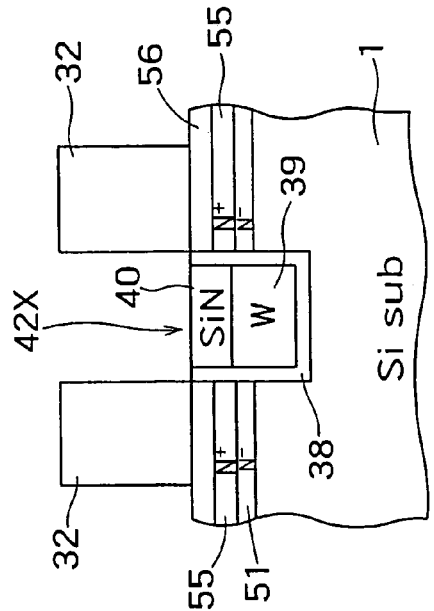
FIG. 10C is a sectional view showing the main parts of a logic circuit portion shown in FIG. 10A.
Figure 10D:
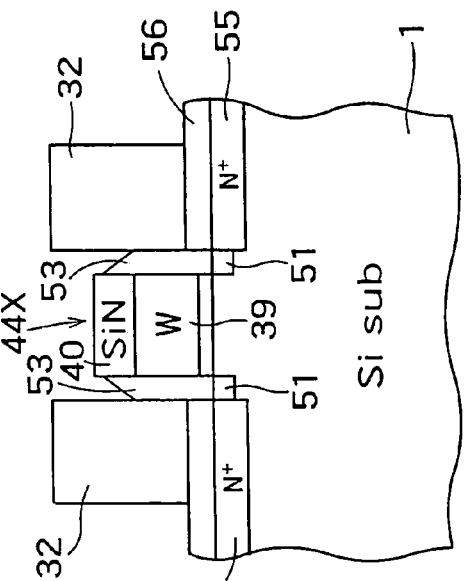
FIG. 10D is a sectional view showing the major components of a logic circuit portion shown in FIG. 10B.
Figure 10A:
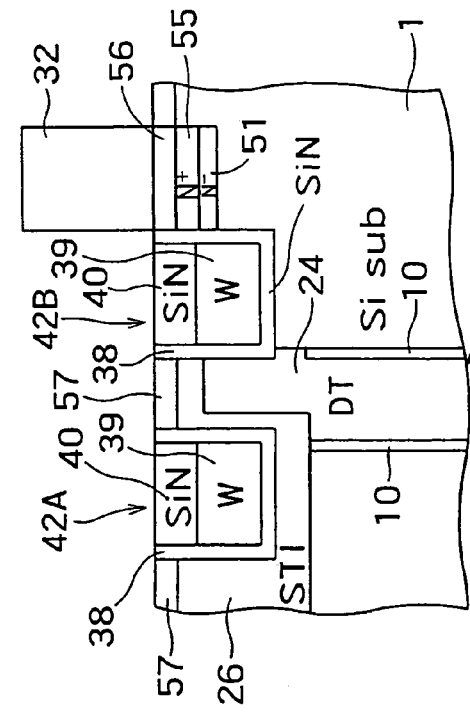
FIG. 10A is a sectional view taken along a line A—A in FIG. 9.
Figure 10B:
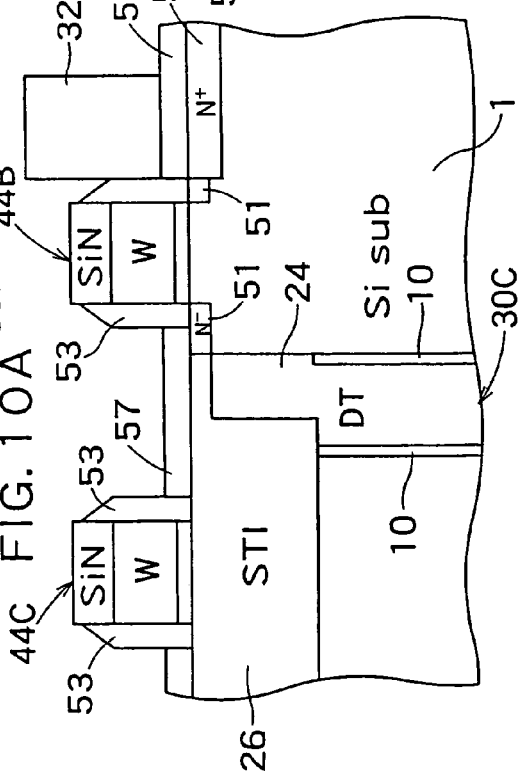
FIG. 10B is a sectional view taken along a line B—B in FIG. 9.

FIG. 10A is a sectional view taken along a line A—A in FIG. 9, and FIG. 10B is a sectional view taken along a line B—B in FIG. 9. Note that in sectional views, including FIGS. 10A to 10D, of this embodiment, only the upper portion of a trench capacitor is shown, and a storage node at the end is omitted. Note also that the internal electrode structure of the capacitor is not shown.

As shown in FIG. 9, the memory cells of this embodiment are four memory cells formed by four trench capacitors 30A to 30D and one bit line contact 32. Referring to FIG. 9, a cross-shaped pattern 34 having the bit line contact 32 as its center indicates an element region. The outside of this element region 34 is an element isolation region 26 formed by STI (Shallow Trench Isolation).

Although the capacitors 30A to 30D can have polysilicon electrodes, the capacitors having metal electrodes according to the first and second embodiments of the present invention are more desirable because high-speed operations are possible.

Referring to FIG. 9, gate electrodes 42A to 42D running in the longitudinal direction are gate electrodes buried lower than the substrate surface of a silicon substrate 1. The gate electrode 42B is a word line of the capacitor 30D, and the gate electrode 42C is a word line of the capacitor 30B.

Gate electrodes 44A and 44B running in the lateral direction in FIG. 9 are gate electrodes formed on the substrate surface of the silicon substrate 1. The gate electrode 44A is a word line of the capacitor 30A, and the gate electrode 44B is a word line of the capacitor 30C.

The buried gate electrodes 42A to 42D are linearly formed adjacent to the cell capacitors. The gate electrodes 44A and 44B formed on the substrate surface have bent interconnection patterns, as shown in FIG. 9, in order to well increase the distance to gate cell capacitors to be controlled, and the gate length.

The bit line contact 32 is formed in self-alignment on a diffusion layer 55 surrounded by the four gates 42B, 42C, 44A, and 44B.

In the structure shown in FIG. 10A, by adjusting the voltage to be applied to the gate electrode 42B serving as a word line, the range of a depletion layer spreading in the silicon substrate 1 can be controlled. Accordingly, an electrode 24 of the trench 30D and the bit contact 32 can be electrically connected or disconnected.

Likewise, in the structure shown in FIG. 10B, the range of a depletion layer spreading in the silicon substrate 1 can be controlled by adjusting the voltage to be applied to the gate electrode 44B serving as a word line. This allows electrical switching between an electrode 24 of the trench 30C and the bit contact 32.

In this embodiment, the buried gate electrodes 42 and the gate electrodes 44 which are formed on the substrate surface and perpendicular to the buried gate electrodes 42 are used as word lines. Consequently, the four memory cell capacitors 30A to 30D can be connected to one bit line contact 32. In the device shown in FIGS. 19A to 20C, only two memory cell capacitors are connected to one bit line contact. That is, this embodiment can increase the integration density, compared to the DRAM cell shown in FIGS. 19A to 20C, when the same design rule is applied.

FIG. 10C is a sectional view showing the main components of a logic circuit portion corresponding to FIG. 10A. That is, FIG. 10C shows the sectional structure of an FET (Field Effect Transistor) of a logic circuit portion using a buried gate. Referring to FIG. 10C, a gate electrode 39 surrounded by a gate insulating film 38 is buried in the substrate 1.

Each of the buried gate electrode 42B and a buried gate electrode 42X has a stacked structure of the tungsten layer 39 and a silicon nitride layer 40. Under adjacent bit line contacts 32, the diffusion layer 55 is formed below salicide 57.

This embodiment uses these buried gate electrodes and hence has the effect of suppressing transistor short channels in the logic portion. A similar effect is obtained in a capacitor cell portion. That is, referring back to FIG. 10A, the gate electrode 42B surrounded by the insulating layer 38 is buried between the capacitor 30D and the lower portion of the bit line contact 32. This suppresses the short channel effect between the capacitor and the bit line contact.

FIG. 10D is a sectional view showing the major components of a logic circuit portion corresponding to FIG. 10B. That is, FIG. 10D shows the sectional structure of a logic circuit portion in which a gate electrode on the substrate surface is a word line. Similar to the trench cell capacitor shown in FIG. 10B, salicide 57 is formed on the diffusion layer 55 on the bit line contact side, and each of the gate electrode 44B and a gate electrode 44X has a stacked structure of the tungsten layer 39 and the silicon nitride layer 40. In this structure, an LDD (Lightly Doped Drain) region 51 is preferably formed to prevent the short channel effect. The side walls of the gate electrode 44X are covered with a side wall protective insulating film 53 for forming the LDD region 51.

Figure 11:
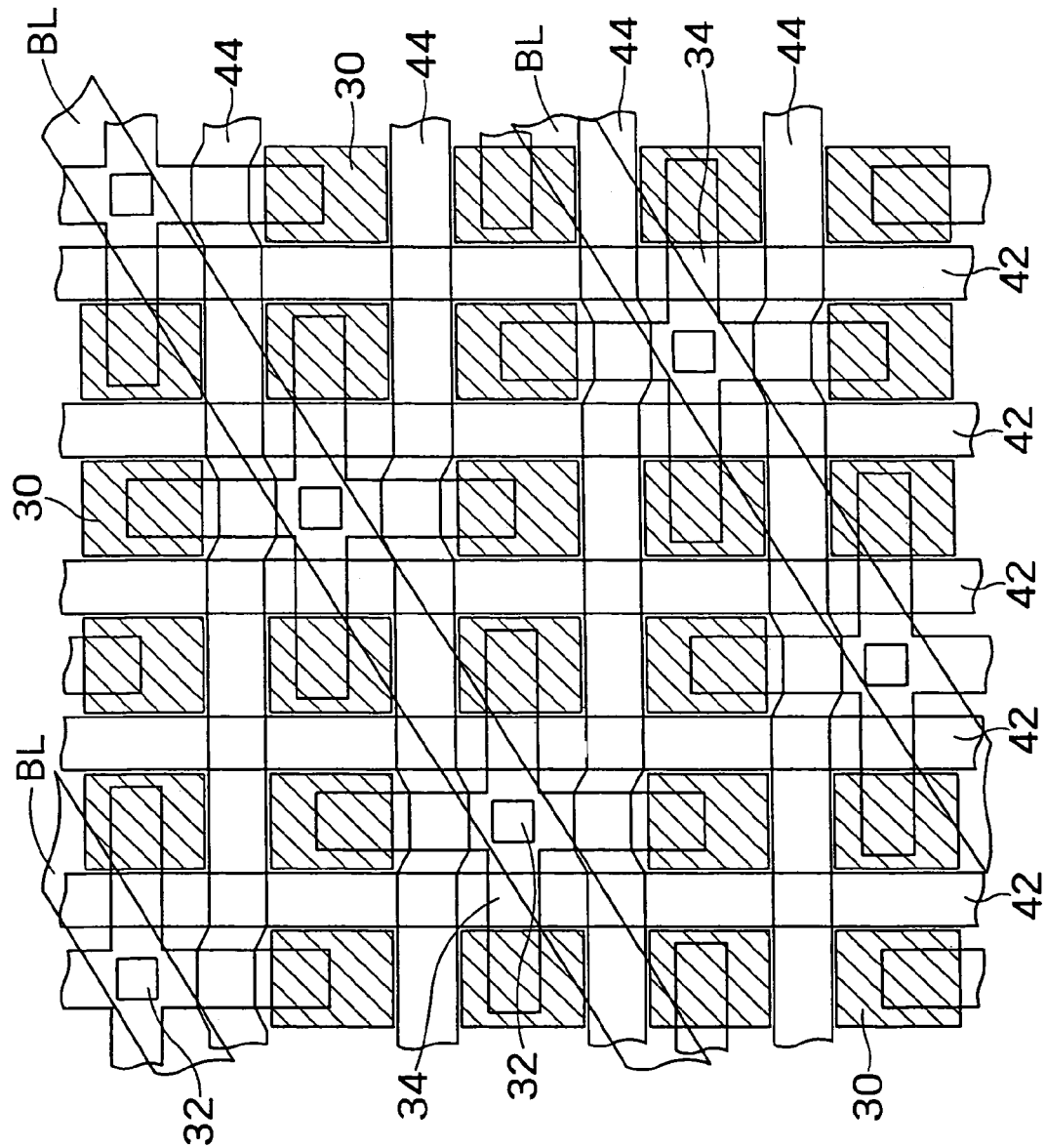
FIG. 11 is a plan layout view showing an example of the cell structure of a DRAM.

FIG. 11 is a plan layout view showing an example of the cell structure of a DRAM. Trench capacitors 30 serving as memory cells are arranged in a matrix manner such that their long and short edges point in the longitudinal and lateral directions, respectively, in FIG. 11. Also, buried electrodes 42 run in the longitudinal direction of FIG. 11, and gate electrodes 44 on the substrate surface run in the lateral direction of FIG. 11. Bit lines BL run obliquely to these two types of gate electrodes 42 and 44 perpendicular to each other. These bit lines BL are connected to predetermined bit contacts 32.

A method of fabricating the semiconductor device of this embodiment will be described below.

FIGS. 12A to 18B are sectional views showing the steps of fabricating the memory cells and logic circuit portions of this embodiment. Of these drawings, FIGS. 12A to 13B, 15A, 15B, 17A, and 17B illustrate the steps of the memory cell and logic circuit portion using buried gate electrodes. FIGS. 14A, 14B, 16A, 16B, 18A, and 18B depict the steps of the memory cell and logic circuit portion in which gate electrodes are formed on the substrate surface.

First, as shown in FIGS. 12A and 12B, grooves for gate electrodes are formed. More specifically, a trench memory capacitor 30 and a buried element isolation region 26 are formed in the surface of a silicon substrate 1. The element isolation region 26 can be formed by, e.g., the STI technology. Next, a protective film is deposited on the surface of the substrate 1 and patterned to form a mask by lithography. Grooves G are formed in $SiO_2$ of the substrate 1 and the element isolation region 26 by RIE. The protective film can have a stacked structure of TEOS 28 and SiN 200 each about 200 nm thick. Silicon and $SiO_2$ in the mask opening portions are selectively etched by this RIE. The etching amount is, e.g., a depth of about 300 nm from the surface of the substrate 1.

Subsequently, as shown in FIGS. 13A and 13B, gate electrodes are formed. First, a gate insulating film 38 is formed on the inner wall surfaces of the exposed grooves G. This gate insulating film 38 has an $SiO_2$/SiN deposited structure formed by depositing a silicon nitride film after the silicon surface is oxidized, or by nitriding a silicon oxide film. The thickness of the gate insulating film 38 can be about 5 nm. After that, a metal 39 serving as gate electrodes is deposited, and CMP (Chemical Mechanical Polishing) is performed to polish to the RIE protective film 28, thereby removing the metal deposited on the surface. In addition, CDE (Chemical Dry Etching) is performed to etch back the gate insulating film 38 to a portion below the surface of the substrate 1. Furthermore, an insulator 40 serving as an upper protective film of gate electrodes is deposited. This insulator deposited on regions other than the grooves G is removed by CMP and CDE. The metal 39 serving as gate electrodes is, e.g., W (tungsten) about 200 nm thick. The protective insulating film 40 of gate electrodes can be an SiN film about 500 nm thick.

Figure 14B:
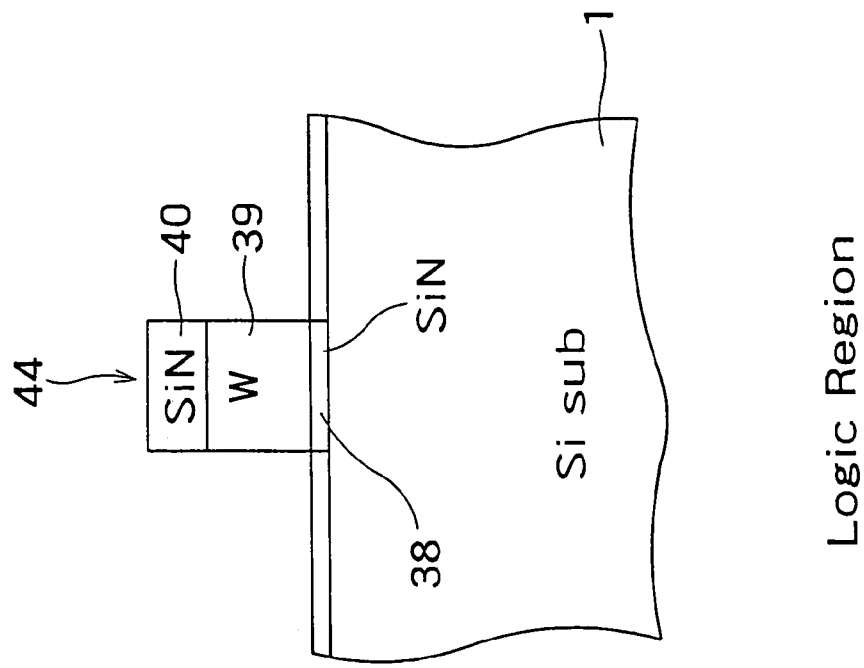
FIGS. 14A and 14B are sectional views showing the steps of the method of fabricating the memory cell and logic circuit portion of the third embodiment.
Figure 14A:
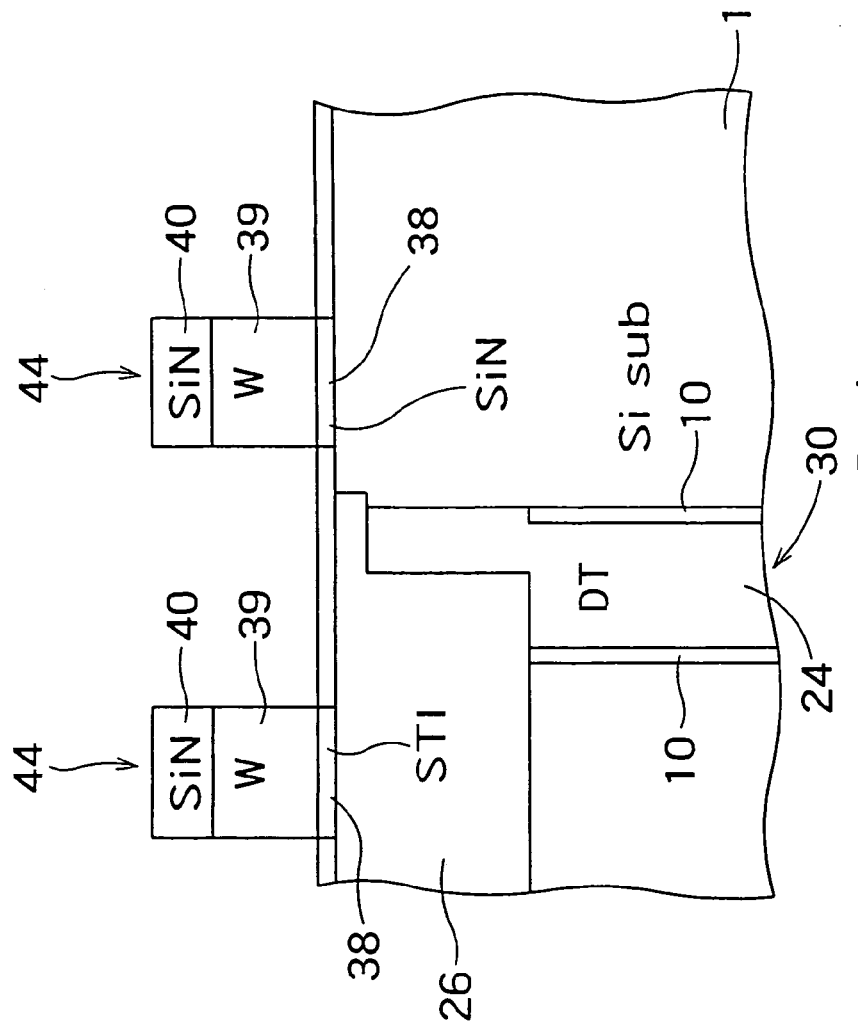
Figure 20A:
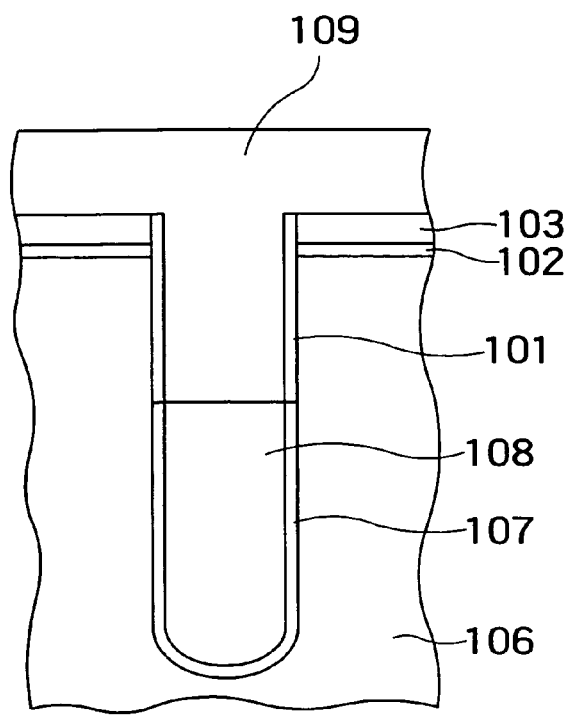
FIGS. 20A to 20C are sectional views showing the steps of the method of fabricating the trench capacitor relevant to the present invention.
Figure 20B:
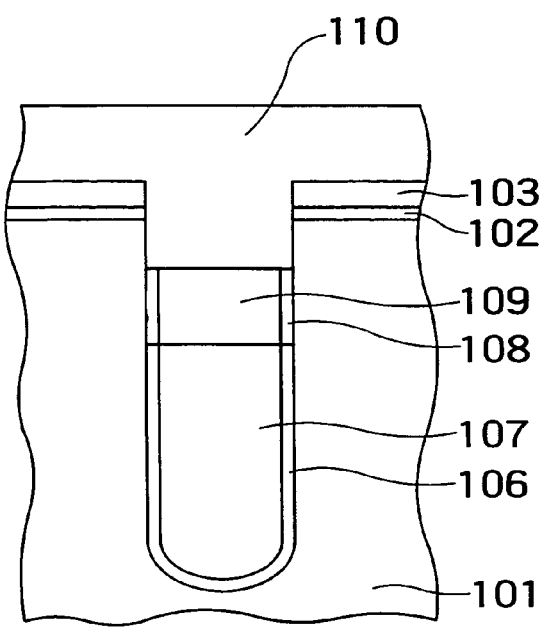
Figure 20C:
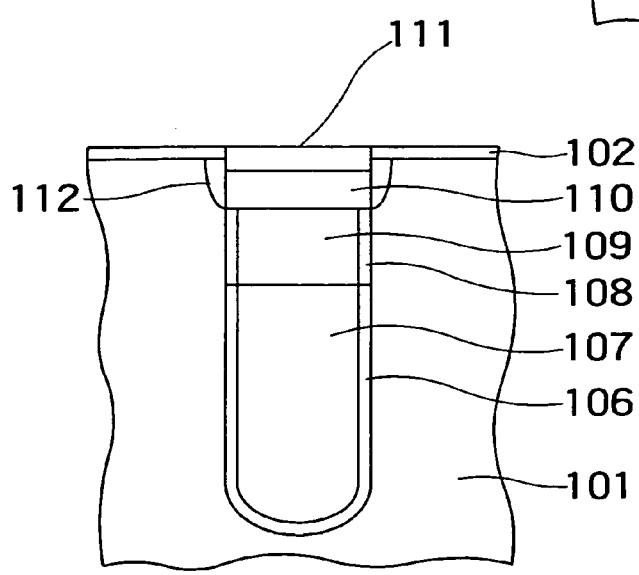

As shown in FIGS. 14A and 14B, the steps of forming gate electrodes on the silicon substrate 1 is started. First, the protective film 28 on the substrate surface is removed, and a gate insulating film 38 is formed in prospective gate electrode regions. A metal 39 serving as gate electrodes and a protective insulating film 40 as the upper portions of gate electrodes are deposited, patterned by lithography, and processed by RIE, thereby forming gate electrodes 44.

As shown in FIGS. 15A and 15B, P (phosphorus) ions are implanted to form an N⁻ diffusion layer 54 in element regions of the memory cell and the n-type logic circuit portion. The ion implantation condition is such that this N⁻ diffusion layer 54 is deeper than an N⁺ diffusion layer 55 to be formed later by ion implantation. In a memory cell structure in which a buried gate electrode 42 functions as a word line, the N⁻ diffusion layer 54 is formed only on the bit line contact side.

As shown in FIGS. 16A and 16B, in a memory cell structure in which a gate electrode on the substrate surface functions as a word line, P ions are implanted to form N⁻ diffusion layers 51 on both the bit line contact side and the trench cell capacitor side. In addition, an insulating film serving as a protective film of the gate side walls is deposited and etched back by RIE, thereby completely protecting the metal serving as the gate electrodes with a side wall insulating film 53.

Finally, as shown in FIGS. 17A to 18B, As (arsenic) ions are implanted to form N⁺ diffusion layers 55 in the lower portions of bit line contacts 32 and in source and drain portions of the logic circuit portion. A metal is deposited on these N⁺ diffusion layers 55 and allowed to react to form salicide 56. Before that, a protective film 57 made of, e.g., TEOS is deposited on the cell capacitor side of the gate electrodes 42 and 44, so that the N⁺ diffusion layers 55 and the salicide 56 are not formed. After that, a dielectric interlayer 60 is deposited and planarized by CMP, forming bit line contacts 32 and source and drain contacts 32. Since the metal layer 39 serving as the gate electrode is protected by the insulating film, these contacts 32 can be easily formed. For example, the contacts 32 can be formed in self-alignment by selective etching of contact holes and selective growth of W (tungsten).

That is, the gate insulating film 38 is formed on the side walls of the metal layer 39 serving as the gate electrodes, and the bit line contacts 32 are formed in contact with this gate insulating layer 38. Accordingly, the bit line contact 32 can be formed in self-alignment.

After that, a DRAM/logic-embedded device is completed through the normal DRAM and logic multilayered interconnection processes.

This embodiment can raise the integration density of an embedded device having both a DRAM and a logic circuit.

The embodiments of the present invention have been explained with reference to practical examples. However, the present invention is not restricted to these practical examples.

For example, those skilled in the art can obtain similar effects by properly changing, within the scope of the present invention, the structures and materials of the semiconductor devices as explained above.

In the first and second embodiments as described above, at least a portion of a trench capacitor electrode is formed by a metal. This can lower the electrical sheet resistance of the electrode and shorten the signal propagation time prolonged by CR delay. As a consequence, the read/write time can be reduced.

Also, the third embodiment described above can realize a reduction of the cell area, which is required in a DRAM and a DRAM/logic-embedded device. The use of a buried gate electrode structure in a cell transistor and a logic circuit portion increases the gate length, and this can reduce the short channel effect. Since an insulating protective film is deposited on a gate electrode, a bit line contact can be formed in self-alignment.

What is claimed is:

1. A semiconductor device comprising:
a bit line contact;
four memory capacitors formed around said bit line contact; and
four gate electrodes formed between said four memory capacitors and said bit line contact,
wherein each of said four memory capacitors and said bit line contact can be connected or disconnected by changing a voltage to be applied to a corresponding one of said four gate electrodes.

2. A device according to claim 1, wherein said memory capacitors are trench capacitors formed in a silicon substrate.

3. A device according to claim 1, wherein
at least two of said four gate electrodes are formed on a predetermined surface, and
the other two of said four gate electrodes are formed below the predetermined surface.

4. A device according to claim 3, wherein
an insulating layer is formed on the side walls of said gate electrodes formed on the predetermined surface, and
said bit line contact is formed in contact with said insulating layer.

5. A semiconductor device comprising:
a bit line contact;
a plurality of gate electrodes formed around said bit line contact; and
a plurality of memory capacitors formed around said bit line contact,
wherein each of said plurality of memory capacitors and said bit line contact can be connected or disconnected by changing a voltage to be applied to a corresponding one of said plurality of gate electrodes, and
at least one of said plurality of gate electrodes is formed on a predetermined surface, and the other of said plurality of gate electrodes is formed below the predetermined surface.

6. A device according to claim 5, wherein
an insulating layer is formed on the side walls of said gate electrode formed on the predetermined surface, and
said bit line contact is formed in contact with said insulating layer.

7. A device according to claim 5, wherein said memory capacitors are trench capacitors formed in a silicon substrate.

8. A device according to claim 7, wherein said trench capacitors comprise:
a trench formed in a surface portion of a semiconductor substrate;
an insulating layer formed on the inner wall surfaces of said trench; and
an electrode portion formed inside said trench having said insulating layer, and
said electrode portion has a metal portion.

9. A device according to claim 5, wherein said gate electrodes have a metal interconnection layer.

10. A method of fabricating a semiconductor device in which a plurality of trench capacitors and a plurality of gate electrodes are formed around a bit line contact, each of said plurality of trench capacitors can be connected to or disconnected from said bit line contact by changing a voltage to be applied to a corresponding one of said plurality of gate electrodes, and at least one of said plurality of gate electrodes are formed on a predetermined surface of a semiconductor substrate and the other of said plurality of gate electrodes are formed below the predetermined surface, comprising the steps of:

forming said plurality of trench capacitors on the semiconductor substrate;

forming some of the plurality of gate electrodes such that said some gate electrodes are buried in the predetermined surface of said substrate;

forming the remaining ones of said plurality of gate electrodes on the predetermined surface of said substrate so as to be substantially perpendicular to said some gate electrodes;

covering the side surfaces of said remaining gate electrodes with an insulating layer; and forming said bit line contact in contact with said insulating layer, wherein said plurality of trench capacitors correspond to memory capacitors.

\* \* \* \* \*